US009213238B2

(12) United States Patent
Ober et al.

(10) Patent No.: US 9,213,238 B2
(45) Date of Patent: *Dec. 15, 2015

(54) ORTHOGONAL PROCESSING OF ORGANIC MATERIALS USED IN ELECTRONIC AND ELECTRICAL DEVICES

(71) Applicant: Cornell University, Ithaca, NY (US)

(72) Inventors: Christopher K. Ober, Ithaca, NY (US);
George Malliaras, Ithaca, NY (US);
Jin-Kyun Lee, Incheon (KR);
Alexander Zakhidov, McKinney, TX (US); Margarita Chatzichristidi, Athens (GR); Priscilla Dodson, Berkeley, CA (US)

(73) Assignee: Cornell University, Ithaca, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/471,095

(22) Filed: Aug. 28, 2014

(65) Prior Publication Data

US 2015/0205206 A1 Jul. 23, 2015

Related U.S. Application Data

(63) Continuation of application No. 12/994,353, filed as application No. PCT/US2009/044863 on May 21, 2009, now Pat. No. 8,846,301.

(60) Provisional application No. 61/140,420, filed on Dec. 23, 2008, provisional application No. 61/055,798, filed on May 23, 2008.

(51) Int. Cl.
*G03F 7/32* (2006.01)
*G03F 7/30* (2006.01)
*G03F 7/36* (2006.01)
*G03F 7/42* (2006.01)

(Continued)

(52) U.S. Cl.
CPC ............. *G03F 7/16* (2013.01); *G03F 7/0046* (2013.01); *G03F 7/0392* (2013.01); *G03F 7/30* (2013.01); *G03F 7/325* (2013.01); *G03F 7/40* (2013.01);

(Continued)

(58) Field of Classification Search
CPC ...... G03F 7/0046; G03F 7/325; G03F 7/0392; G03F 7/40; G03F 7/16; G03F 7/30; H01L 51/0018; H01L 51/56; H01L 51/0002; Y10T 428/24802; Y02E 10/549
USPC ......... 430/311, 314, 319, 315, 322, 324, 323, 430/325
See application file for complete search history.

(56) References Cited

U.S. PATENT DOCUMENTS 8,846,301 B2 * 9/2014 Ober et al. .............. 430/311

*Primary Examiner* — Caleen Sullivan
(74) *Attorney, Agent, or Firm* — Hodgson Russ LLP

(57) ABSTRACT

An orthogonal process for photolithographic patterning organic structures is disclosed. The disclosed process utilizes fluorinated solvents or supercritical $CO_2$ as the solvent so that the performance of the organic conductors and semiconductors would not be adversely affected by other aggressive solvent. One disclosed method may also utilize a fluorinated photoresist together with the HFE solvent, but other fluorinated solvents can be used. In one embodiment, the fluorinated photoresist is a resorcinarene, but various fluorinated polymer photoresists and fluorinated molecular glass photoresists can be used as well. For example, a copolymer perfluorodecyl methacrylate (FDMA) and 2-nitrobenzyl methacrylate (NBMA) is a suitable orthogonal fluorinated photoresist for use with fluorinated solvents and supercritical carbon dioxide in a photolithography process. The combination of the fluorinated photoresist and the fluorinated solvent provides a robust, orthogonal process that is yet to be achieved by methods or devices known in the art.

10 Claims, 17 Drawing Sheets

(51) Int. Cl.
*G03F 7/20* (2006.01)
*G03F 7/16* (2006.01)
*G03F 7/004* (2006.01)
*G03F 7/039* (2006.01)
*G03F 7/40* (2006.01)
*H01L 51/00* (2006.01)

(52) U.S. Cl.
CPC ........... *H01L 51/0018* (2013.01); *Y02E 10/549* (2013.01); *Y10T 428/24802* (2015.01)

FIG. 9
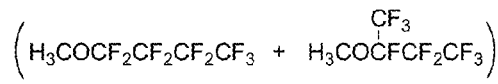
HFE-7100 (bp 61 °C): isomeric mixture of (methyl nonafluorobutyl ether) and (methyl nonafluoroisobutyl ether)
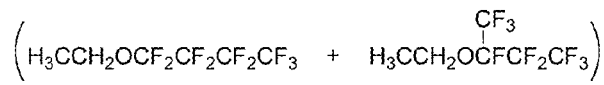
HFE-7200 (bp 76 °C): isomeric mixture of (ethyl nonafluorobutyl ether) and (ethyl nonafluoroisobutyl ether)
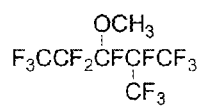   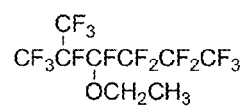
HFE-7300 (bp 100 °C)    HFE-7500 (bp 130 °C)
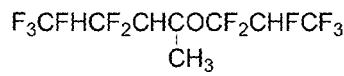
1,1,1,2,3,3,-hexafluoro-4-(1,1,2,3,3,3-hexafluoropropoxy)-pentane
FIG. 10
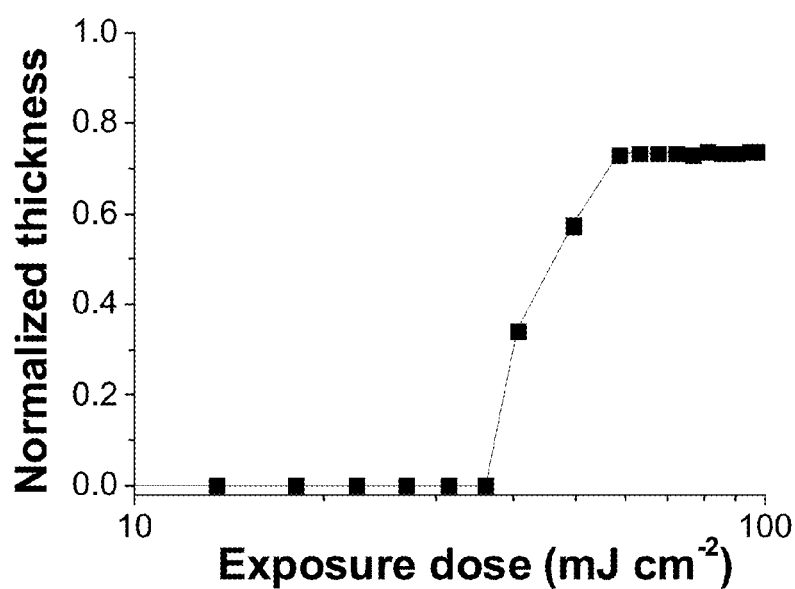

FIG. 13(a)
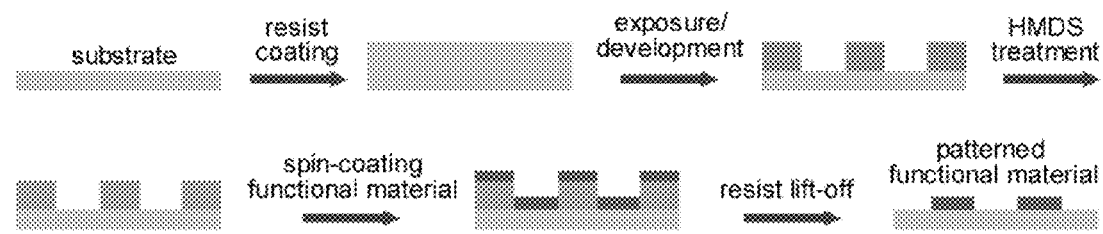
FIG. 13(b)     FIG. 13(c)
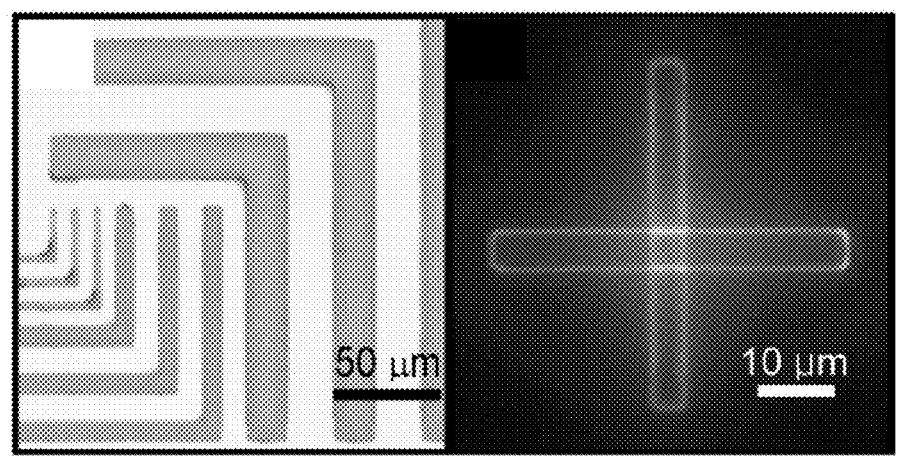
FIG. 14(a)     FIG. 14(b)
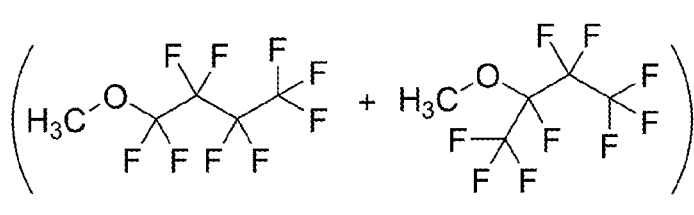     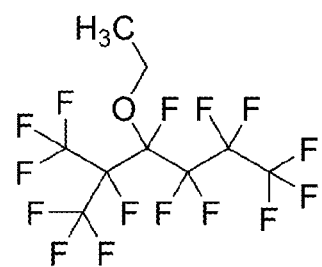

$R^1$ = semi-perfluoroalkyl
$R^2$ = *tert*-butoxycarbonyl

Resist soluble in HFEs $\xrightarrow{\text{H}^+ \text{ generated from PAG}}$ Resist insoluble in HFEs ($R^2$ = H)

FIG. 17
(a)
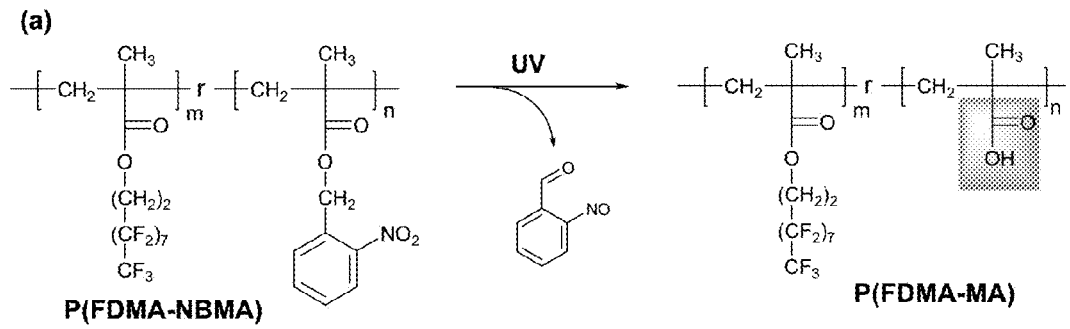
P(FDMA-NBMA) soluble in HFEs → P(FDMA-MA) insoluble in HFEs
(b)
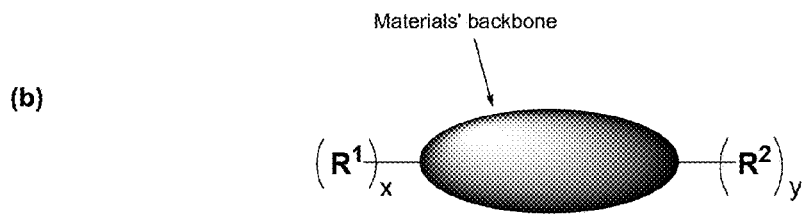
$R^1$ = fluorine-containing functional groups to improve solubility in fluorinated solvents
$R^2$ = Acid or radiation-sensitive functional groups which show solubility-switch under lithographic cinditions
FIG. 18
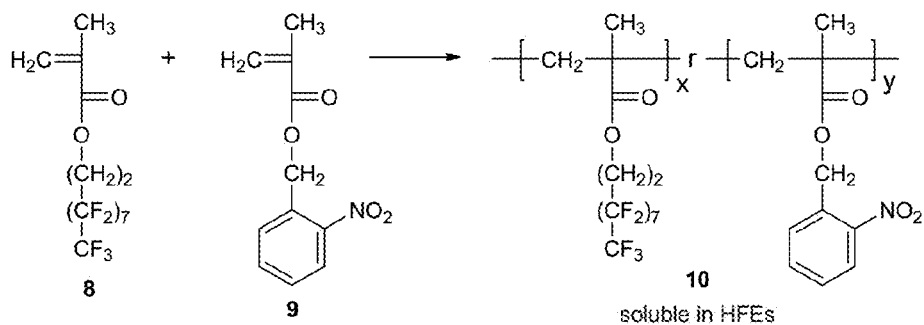
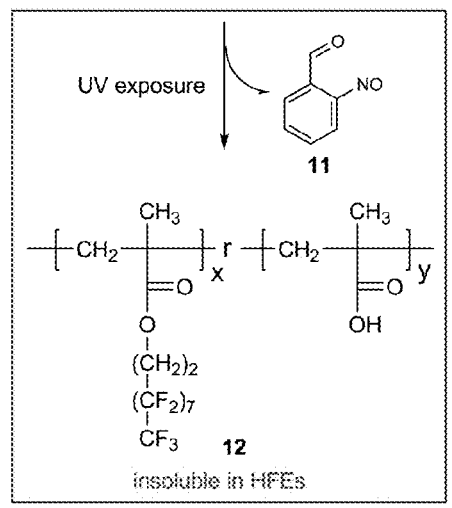

FIG. 20(a)
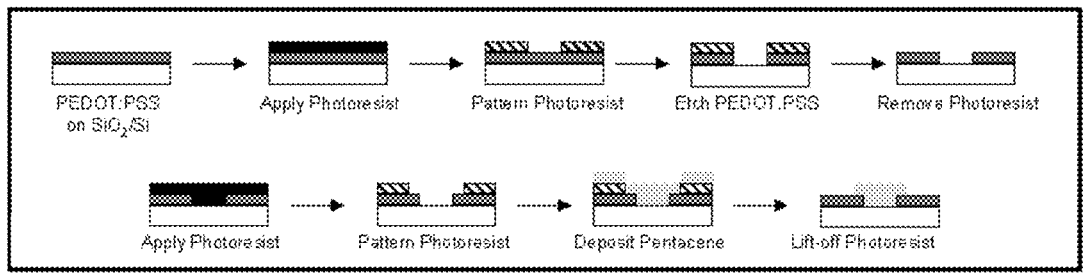
FIG. 20(b)     FIG. 20(c)     FIG. 20(d)
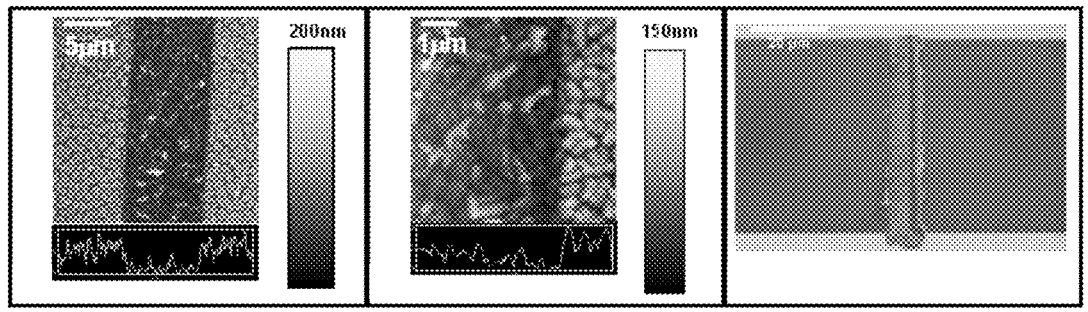
FIG. 20(e)     FIG. 20(f)
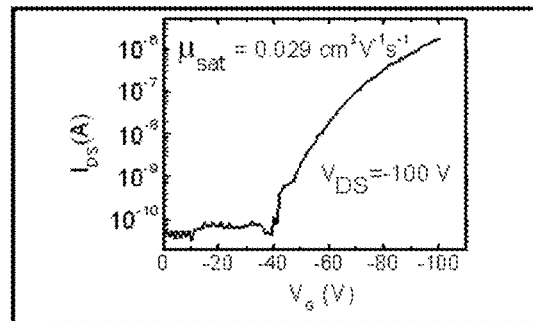 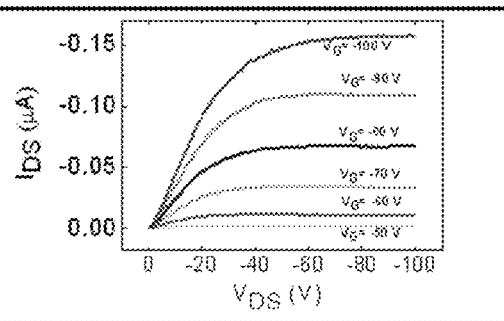

1H NMR of I-137 in CFCl₃ (1 part by vol.) + CDCl₃ (1 part by vol.)

US 9,213,238 B2

ORTHOGONAL PROCESSING OF ORGANIC MATERIALS USED IN ELECTRONIC AND ELECTRICAL DEVICES

This application is a continuation of U.S. patent application Ser. No. 12/994,353filed Mar. 3,2011which is a national stage application of PCT/US09/44863, filed May 21, 2009, which claims the benefit of U.S. Provisional Patent Application No. 61/055,798, filed May 23, 2008, and U.S. Provisional Patent Application No. 61/140,420, filed Dec. 23, 2008, the disclosures of which are incorporated herein by reference.

STATEMENT AS TO FEDERALLY SPONSORED RESEARCH

This invention was made with government support under contract 0602821 awarded by the National Science Foundation. The government has certain rights in the invention.

BACKGROUND

1. Technical Field

An orthogonal process for patterning organic structures is disclosed which utilizes a fluorinated solvent or supercritical $CO_2$ as a solvent for organic materials. The disclosed process may also utilize a fluorinated photoresist in combination with a fluorinated solvent. The fluorinated photoresist may be a resorcinarene, a copolymer of perfluorodecyl methacrylate and 2-nitrobenzyl methacrylate, derivatives thereof or other polymer photoresist or molecular glass photoresists having sufficient fluorine content. The fluorinated photoresist and fluorinated solvent are used to make patterns of various organic structures used in electronic (semiconductor) and electrical devices. For example, the materials and techniques disclosed herein may be applied to the patterning of acidic poly(3,4-ethylenedioxythiophene):poly(styrenesulfonate) (PEDOT:PSS), a widely used organic material for which no other straightforward lithographic patterning method exists.

2. Description of the Related Art

The use of organic materials is becoming widespread in electronic and electrical device fabrication because organic materials can complement conventional inorganic materials to provide lightweight, inexpensive, and mechanically flexible devices. Advantages of using organic materials lie in the low-temperature, high-throughput fabrication processes for such organic materials. The fabrication of a variety of organic electronic and electrical devices such as organic light emitting diodes (OLEDs), organic thin film transistors (OTFTs), organic solar cells, electrodes and sensors has been demonstrated using spin coating, ink-jet printing, and other wet printing techniques.

Like traditional inorganic devices, devices made from organic materials require active functional materials to be tailored into micro-patterned and multi-layered device components. Traditional inorganic devices are typically made using known photolithographic patterning techniques, which provide high-resolution and high-throughput. However, organic semiconductors and other organic electronics or organic electrical structures cannot be made using known photolithographic patterning because of the chemical incompatibility between the organic materials and certain patterning agents, specifically, the solvents used during the patterning process. The use of conventional organic solvents deteriorates the performance of the organic materials during the photoresist deposition and removal. Further, the performance of organic materials deteriorates during the pattern development steps using conventional aqueous base solutions.

To overcome these problems, various strategies have been employed. One strategy is to modify the lithographic conditions to accommodate organic materials. These efforts include the employment of protective coatings between the active material and photoresist films. Other strategies include attempts to find an "orthogonal solvent," or a processing solvent that does not deteriorate the organic layers. Alternative fabrication methods have also been employed including ink-jet printing, shadow mask deposition, vapor deposition through shadow masks, soft and hard imprint lithography, and photolithography. While ink-jet printing boasts continuous roll-to-roll process capabilities and is the patterning technique of choice for polymeric materials, ink-jet printing resolution is limited to approximately 10-20 μm. Shadow mask deposition is the dominant technique for small molecule patterning, but also has notable resolution limitations, typically 25-30 μm at best, although special masks have shown resolution down to 5 μm. Shadow mask deposition also requires a high vacuum environment, which can introduce further limitations. Imprint lithography has demonstrated promising results, showing feature resolution down to 10 nm. However, this technique has only shown limited applicability with respect to materials and device architectures. Furthermore, all of the aforementioned methods suffer from lack of registration, which makes fabrication of multi-layer devices exceptionally challenging. Multi-layer device architecture is essential for achieving integrated circuits.

To date, no methods for the patterning of organic materials has been able to provide the resolution and dependability of photolithography. As a result, photolithography is the most widely-applicable patterning method that consistently achieves both high-resolution and registration. Photolithography has the added advantage of being the most developed patterning technology and the patterning method of choice of the semiconductor industry.

However, as noted above, there are a limited number of available solvents that do not dissolve or adversely damage an organic layer during a photolithography process. Currently, polar and non-polar solvents are used to process non-polar and polar active films respectively. For example, one can form a bi-layer structure by using a polar solvent to deposit a polar film on top of a non-polar film. Accordingly, solvent orthogonality can be achieved either by carefully choosing proper organic material/solvent combinations or by chemical modification of organic materials to achieve the desired polarity. This strategy is however problematic because both polar and non-polar solvents are typically required for photolithographic processes.

Hence, there is a need for an improved approach to the chemical processing of organic materials during the photolithography processes of an organic electronic device fabrication. Further, there is a need for environmentally friendly solvents that are benign to the majority of organic materials used in organic electronic device fabrication. Finally, there is a need for a robust method for processing organic electronic devices that avoids damage to the organic material such as dissolution, cracking, delamination or other unfavorable physical or chemical damage.

SUMMARY OF THE DISCLOSURE

Orthogonal processes for patterning of organic structures are disclosed. The disclosed processes may utilize fluorinated solvents or supercritical $CO_2$ as an "orthogonal" solvent that does not substantially and adversely affect the deposited organic layers. The disclosed process avoids damage to the organic layers during patterning that would be caused by use of conventional solvents.

In a refinement, the disclosed processes may also utilize a fluorinated photoresist together with a fluorinated solvent. The fluorinated photoresist may be a resorcinarene, a copolymer of perfluorodecyl methacrylate and 2-nitrobenzyl methacrylate, derivatives thereof or other polymer photoresist or molecular glass photoresists having sufficient fluorine content. The combination of the fluorinated photoresist and a fluorinated solvent provides a robust, orthogonal process capable of high throughputs.

The fluorinated solvent may be one or more hydrofluoroethers (HFEs) such as methyl nonafluorobutyl ether, methyl nonafluoroisobutyl ether, isomeric mixtures of methyl nonafluorobutyl ether and methyl nonafluoroisobutyl ether, ethyl nonafluorobutyl ether, ethyl nonafluoroisobutyl ether, isomeric mixtures of ethyl nonafluorobutyl ether and ethyl nonafluoroisobutyl ether, 3-ethoxy-1,1,1,2,3,4,4,5,5,6,6,6-dodecafluoro-2-trifluoromethyl-hexane, 1,1,1,2,2,3,4,5,5,5-decafluoro-3-methoxy-4-trifluoromethyl-pentane, 1,1,1,2,3,3-hexafluoro-4-(1,1,2,3,3,3,-hexafluoropropoxy)-pentane and combinations thereof. The fluorinated solvent may also be selected from a broad range of fluorinated solvents, such as chlorofluorocarbons (CFCs): $C_xCl_yF_z$, hydrochlorofluorocarbons (HCFCs): $C_xCl_yF_zH_w$, hydrofluorocarbons (HFCs): $C_xF_yH_z$, perfluorocarbons (FCs): $C_xF_y$, hydrofluoroethers (HFEs): $C_xH_yOC_zF_w$, perfluoroethers: $C_xF_yOC_zF_w$, perfluoroamines: $(C_xF_y)_3N$, trifluoromethyl ($CF_3$)-substituted aromatic solvents: $(CF_3)_xPh$ [benzotrifluoride, bis(trifluoromethyl)benzene], etc.

Improved fluorinated photoresists are also disclosed. The fluorinated photoresists include resorcinarene, copolymers of perfluorodecyl methacrylate and 2-nitrobenzyl methacrylate, derivatives thereof, and other polymer photoresist or molecular glass photoresists having sufficient fluorine content.

Synthetic methods and physical and chemical characterizations of exemplary resorcinarene photoresists are also disclosed herein. Methods for evaluating the lithographic properties of the disclosed fluorinated photoresists are also disclosed.

The disclosed methods and photoresists are applicable to organic electronic devices including, but not limited to various organic semiconductors, organic light emitting diodes (OLEDs), organic thin film transistors (OTFTs), organic solar cells, sensors, etc., and organic electrical devices including, but not limited to electrodes.

Other advantages and features of the disclosed process will be described in greater detail below. Although only a limited number of embodiments are disclosed herein, different variations will be apparent to those of ordinary skill in the art and should be considered within the scope of this disclosure.

BRIEF DESCRIPTION OF THE DRAWINGS

For a more complete understanding of the disclosed process, reference should be made to the embodiments illustrated in greater detail in the accompanying drawings, wherein:

FIG. 9 illustrate the chemical structures of HFEs used in accordance with this disclosure;

FIG. 10 is a contrast curve under UV ($\lambda$=365 nm) exposure conditions for the resorcinarene 6 (FIG. 1) in combination with a photo acid generator (PAG) (5% w/w over 6) on a Si wafer:

FIG. 13(a) schematically illustrates a procedure for the lift-off patterning of functional materials in accordance with this disclosure;

FIG. 13(b) is an optical microscope image of a patterned P3HT in accordance with this disclosure;

FIG. 13(c) is a fluorescent microscope image of overlaid patterns (feature width 5 μm) of poly(9,9-dioctylfluorene) (top) and $[Ru(bpy)_3]^{2+}(PF_6^-)_2$ (bottom) in accordance with this disclosure;

FIG. 14(a) illustrates the chemical structures of a disclosed HFE solvents including a mixture of two isomers, with a boiling point of 61° C.;

FIG. 14(b) illustrates the chemical structure of another disclosed HFE solvent with a boiling point of 130° C.;

FIG. 17 illustrates alternative fluorinated photoresists to the resorcinarene illustrated in FIG. 1;

FIG. 18 illustrates the synthesis of the fluorinated photoresist illustrated in FIG. 17;

FIGS. 20(a)-20(f) illustrate a photolithography process of PEDOT:PSS/pentacene bottom-contact OTFT including (a) a schematic illustration of device fabrication, (b) an AFM image of a 5 μm (width)×50 μm (length) pentacene channel between PEDOT:PSS electrodes, (c) another AFM image of a 5 μm (width)×50 μm (length) pentacene channel between PEDOT:PSS electrodes, (d) an optical image of OTFT, (e) a device performance plot and (f) another device performance plot;

Figure 1:
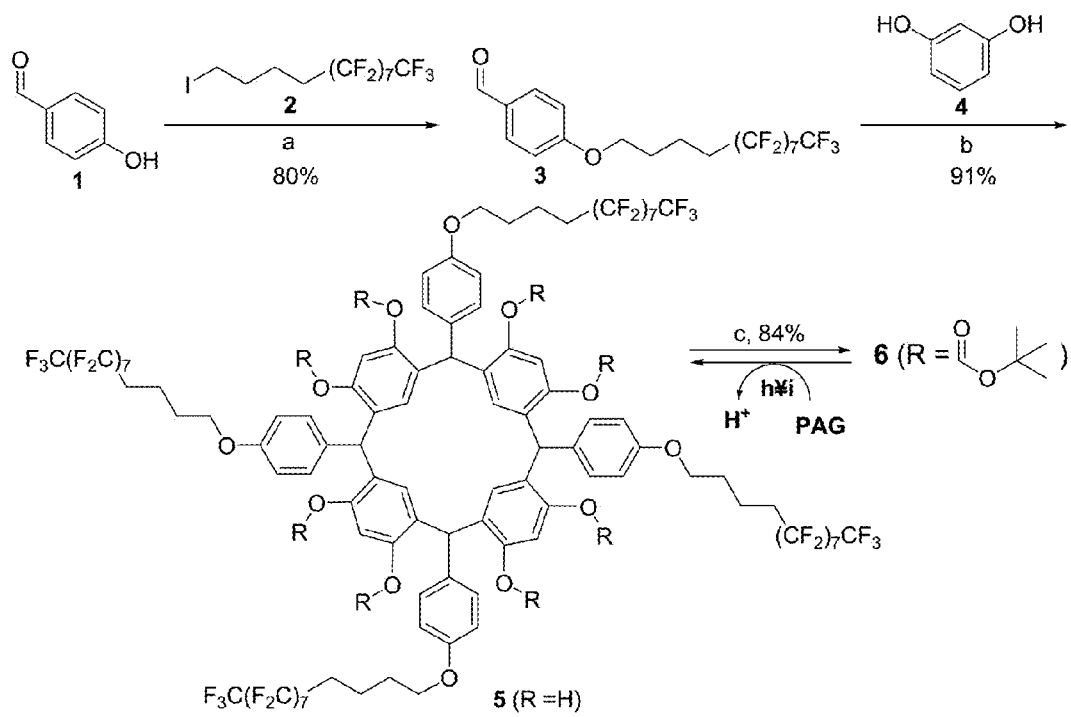
FIG. 1 is a schematic illustration of the synthesis procedure for a resorcinarene 5 in accordance with this disclosure.

In certain instances, details which are not necessary for an understanding of the disclosed processes or materials or which render other details difficult to perceive may have been omitted. It should be understood, of course, that this disclosure is not limited to the particular embodiments illustrated herein.

DETAILED DESCRIPTION OF THE PRESENTLY PREFERRED EMBODIMENTS

The term chemical processing as used herein shall mean any chemical treatment such as cleaning, depositing a second layer from solution to form multilayer devices, and depositing/developing resist layers for photolithographic patterning.

Fluorous Solvents

Fluorous solvents are perfluorinated or highly fluorinated liquids, which are typically immiscible with organic solvents and water. Among those solvents, segregated hydrofluoroethers (HFEs) are well known to be highly environmentally friendly, "green" solvents. HFEs are non-flammable, have zero ozone-depletion potential, low global warming potential and show very low toxicity to humans. HFEs were introduced to industry in 1994 as third generation hydrofluorocarbon liquids to be used as replacement of chlorofluorocarbons and hydrochlorofluorocarbon refrigerants. HFEs have also been demonstrated as environmental friendly cleaning solvents for electronics. Nevertheless, the use of HFEs in the processing of organic electronics and electrical structures is yet to be reported.

One or more hydrofluoroethers (HFEs) may be used, such as methyl nonafluorobutyl ether, methyl nonafluoroisobutyl ether, isomeric mixtures of methyl nonafluorobutyl ether and methyl nonafluoroisobutyl ether, ethyl nonafluorobutyl ether, ethyl nonafluoroisobutyl ether, isomeric mixtures of ethyl nonafluorobutyl ether and ethyl nonafluoroisobutyl ether, 3-ethoxy-1,1,1,2,3,4,4,5,5,6,6,6-decafluoro-2-trifluoromethyl-hexane, 1,1,1,2,2,3,4,5,5,5-decafluoro-3-methoxy-4-trifluoromethyl-pentane, 1,1,1,2,3,3-hexafluoro-4-(1,1,2,3,3,3,-hexafluoropropoxy)-pentane and combinations thereof.

Readily available HFEs include isomeric mixtures of HFEs including, but not limited to methyl nonafluorobutyl ether and methyl nonafluoroisobutyl ether (HFE 7100; FIGS. 9 and 14(a)), ethyl nonafluorobutyl ether and ethyl nonafluoroisobutyl ether (HFE-7200; FIG. 9), 3-ethoxy-1,1,1,2,3,4,4,5,5,6,6,6-dodecafluoro-2-trifluoromethyl-hexane (HFE 7500; FIGS. 9 and 14(b)) and 1,1,1,2,3,3-hexafluoro-4-(1,1,2,3,3,3,-hexafluoropropoxy)-pentane (HFE 7600; FIG. 9).

The fluorinated solvent may also be selected from a broad range of fluorinated solvents, such as chlorofluorocarbons (CFCs): $C_xCl_yF_z$, hydrochlorofluorocarbons (HCFCs): $C_xCl_yF_zH_w$, hydrofluorocarbons (HFCs): $C_xF_yH_z$, perfluorocarbons (FCs): $C_xF_y$, hydrofluoroethers (HFEs): $C_xH_yOC_zF_w$, perfluoroethers: $C_xF_yOC_zF_w$, perfluoroamines: $(C_xF_y)_3N$, trifluoromethyl (CF$_3$)-substituted aromatic solvents: $(CF_3)_xPh$ [benzotrifluoride, bis(trifluoromethyl)benzene], etc.

Resorcinarenes

The synthesis and evaluation of a semi-perfluoroalkyl resorcinarene, which is capable of being processed in fluorinated solvents, is described herein. This novel, high-performance imaging material is specifically designed to be orthogonal to the vast majority of organic electronic and electrical structures and hence enable their photolithographic patterning. Furthermore, this material paves the way for the multilevel patterning of organic structures, as demonstrated by the fabrication of overlaid patterns of a polyfluorene and a transition metal complex.

In general, materials with higher fluorine content dissolve better in fluorous solvents. On the other hand, those materials are less adhesive on non-fluorinated surfaces. Therefore, a material with a limited degree of fluorination while still exhibiting sufficient solubility and uniform dissolution behavior in fluorinated solvents was needed. Applicants have found that resorcinarene materials show excellent patterning properties under conventional lithographic conditions. The same molecular framework was adapted, to which four semi-perfluoroalkyl chains and eight acid-cleavable tert-butoxycarbonyl (t-Boc) groups were appended. The resulting resorcinarene 6 in FIG. 1 had 36% fluorine content by weight. Resorcinarene 6 is able to form a negative tone image by transformation into an insoluble form upon an acid-catalyzed deprotection reaction, in which H+ is liberated from the photoacid generator (PAG) under UV exposure (FIG. 1).

As illustrated in FIG. 1, synthesis of the resorcinarene 6 can begin with the alkylation of 4-hydroxybenzaldehyde 1 with the semi-perfluroalkyl iodide 2. The recrystallized product 3 was then reacted with an equimolar amount of resorcinol under acidic conditions. The resorcinarene 5, which is only sparingly soluble in THF, was recovered as a fine, pale-yellow powder in high yield. Size exclusion chromatography showed that the product 5 is composed mainly of two compounds, one with a number average molecular weight (Mn) of about 2500 and the other with a Mn of about 1700 compared to the polystyrene standard. Without being bound by any particular theory, it is believed that those two are stereo-isomers which have different hydrodynamic volumes. The presence of stereo-isomers may stabilize the amorphous state of the resorcinarene 6, which would enable quality film formation. t-Boc protection of the eight hydroxyl groups in the resorcinarene 5 is completed in a mixed solvent of THF and benzotrifluoride. Thermogravimetric analysis (TGA) and differential scanning calorimetry (DSC) shows that resorcinarene 6 is thermally stable up to 150° C. and undergoes glass transition at 82° C. Solubility tests confirmed that resorcinarene 6 is moderately soluble in HFE-7200 (FIG. 9).

Photo-Acid Generators

Figure 12A:
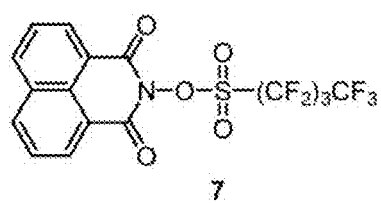
FIG. 12(a) illustrates the structure of a PAG used in the lithographic evaluation in accordance with this disclosure.

Lithographic evaluation began with spin-coating films of the resorcinarene 6 and PAG mixture on various substrates. The PAG 7 illustrated in FIG. 12(a) is N-nonafluorobutanesulfonyloxy-1,8-naphthalimide (or N-hydroxynaphthalimide perfluorobutylsulfonate) and was employed because of its good sensitivity under UV (λ=365 nm) exposure conditions. Other suitable PAGs may include N-nonafluoropropane-sulfonyloxy-1,8-naphthalimide, N-nonafluoroethane-sulfonyloxy-1,8-naphthalimide, N-nonafluoromethane-sulfonyloxy-1,8-naphthalimide.

Still other PAGs include triarylsulfonium perfluroalkanesulfonates such as triphenylsulfonium perfluorooctanesulfonate, triphenylsulfonium perfluorobutanesulfonate and triphenylsulfonium trifluoromethanesulfonate:

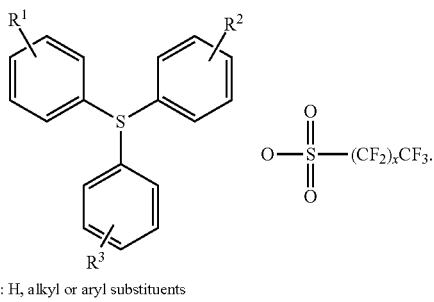

$R^1, R^2, R^3$: H, alkyl or aryl substituents

Triarylsulfonium hexafluorophosphates (or hexafluoroantimonates) such as triphenylsulfonium hexafluorophosphate and triphenylsulfonium hexafluoroantimonate may be used as PAGs:

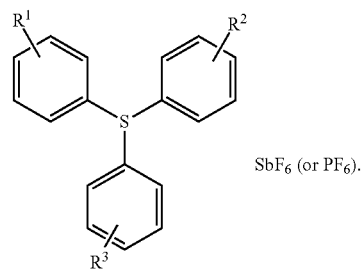

$R^1, R^2, R^3$: H, alkyl or aryl substituents

Triaryliodonium perfluroalkanesulfonates such as diphenyliodonium perfluorooctanesulfonate, diphenyliodonium perfluorobutanesulfonate, diphenyliodonium trifluoromethanesulfonate, di-(4-tert-butyl)phenyliodonium, perfluorooctanesulfonate, di-(4-tert-butyl)phenyliodonium perfluorobutanesulfonate, and di-(4-tert-butyl)phenyliodonium trifluoromethanesulfonate may also be used a PAGs:

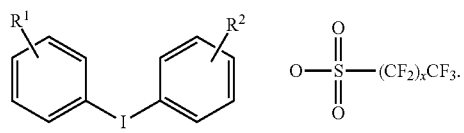

$R^1, R^2$: H, alkyl or aryl substituents

Triaryliodonium hexafluorophosphates (or hexafluoroantimonates) such as diphenyliodonium hexafluorophosphate, diphenyliodonium hexafluoroantimonate, di-(4-tert-butyl) phenyliodonium hexafluorophosphate, and di-(4-tert-butyl) phenyliodonium hexafluoroantimonate may be used as PAGs:

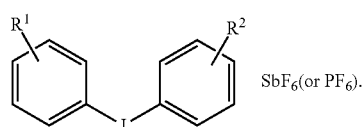

$R^1, R^2$: H, alkyl or aryl substituents

Norbornene-based non-ionic PAGs such as n-hydroxy-5-norbornene-2,3-dicarboximide perfluorooctanesulfonate, n-hydroxy-5-norbornene-2,3-dicarboximide perfluorobutanesulfonate, and n-hydroxy-5-norbornene-2,3-dicarboximide trifluoromethanesulfonate may be used:

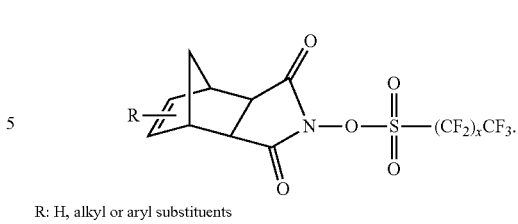

R: H, alkyl or aryl substituents

Naphthalene-based non-ionic PAGs such as n-hydroxynaphthalimide perfluorooctanesulfonate, n-hydroxynaphthalimide perfluorobutanesulfonate and n-hydroxynaphthalimide trifluorometahnesulfonate may also be used:

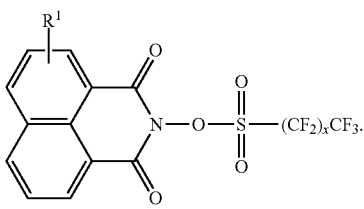

$R^1$: H, alkyl or aryl substituents

Suitable PAGs are not limited to those specifically mentioned above. Combinations of two or more PAGs may be used as well, which may or may not include PAG 7.

Further, while the examples disclosed herein utilize UV radiation, electron beam and other forms of radiation are possible and considered within the scope of this disclosure.

Figure 12B:
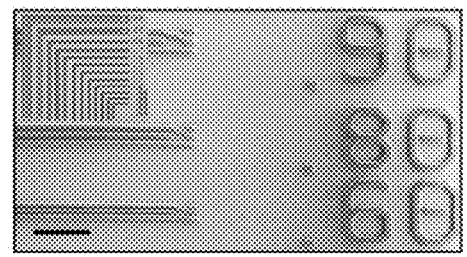
FIG. 12(b) is an SEM image of the resorcinarene 6 (FIG. 1) on a glass wafer (scale bars are 10 μm) in accordance with this disclosure.
Figure 12C:
FIG. 12(c) is an optical microscope image of the resorcinarene 6 (FIG. 1) on a polyimide-coated wafer (scale bars are 10 μm) in accordance with this disclosure.
Figure 12D:
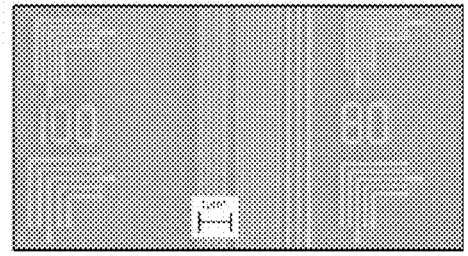
FIG. 12(d) is an SEM image of the resorcinarene 6 (FIG. 1) on a Si wafer under e-beam exposure conditions (100 nm and 80 nm patterns) in accordance with this disclosure.

Uniform films were cast on Si, glass and polyimide-coated wafers from a solution in HFE-7500 (4 parts by vol.) mixed with a small amount of propylene glycol methyl ether acetate (1 part by vol.). Following UV exposure (84 mJ cm-2 with Si substrate), baking (at 70° C.) and development in HFE-7200, at least 600 nm features were generated on the aforementioned substrates, as illustrated in FIGS. 12(b) and 12(c). As illustrated in FIG. 12(d), under electron-beam exposure conditions, 80 nm patterns could be achieved without extensive optimization, which demonstrates that lithography employing fluorinated solvents can be a useful tool to realize sub 100 nm features.

The new imaging material and lithographic processing in fluorinated solvents can be applied to fabricating micron-sized patterns of organic electronic materials. FIG. 13(a) illustrates a procedure for lift-off patterning. A developed resorcinarene image becomes soluble again in fluorinated solvents through treatment with a solubilizing agent such as a silazane. One suitable solubilizing agent is hexamethyldisilazane (HMDS; 1,1,1,3,3,3-hexamethyldisilazane), which reprotects the phenolic hydroxyl residue with trimethylsilyl (TMS) group. Other solubilizing agents include heptamethyldisilazane, 1,1,3,3-tetramethyldisilazane and combinations thereof with or without HMDS. Deposition of an organic material and following lift-off of the resorcinarene film in hot HFE-7100 generate an organic material pattern. It is demonstrated that poly(3-hexylthiophene) (P3HT) (FIG. 13(b)), poly(3,4-ethylenedioxythiophene):poly(styrenesulfonate) (PEDOT:PSS) and Au could be patterned down to 5 µm size. As a step further, an overlaid materials pattern was fabricated to demonstrate, for the first time, the multilevel patterning of solution capable of processing organic layers. The electroluminescent material poly(9,9-dioctylfluorene) was patterned first according to the scheme in FIG. 2, and then the same procedure was repeated with tris(2,2'-bipyridine)ruthenium (II)bis(hexafluorophosphate) [Ru(bpy)3]2+(PF6-)2 on top of the patterned poly(9,9-dioctylfluorene) film. As illustrated in FIG. 13(c), overlaid features down to 5 µm size were made successfully. The results show that the new imaging material described here brings unique capabilities to the world of organic electronics.

Experimental (Resorcinarene; FIGS. 1-16)

Materials and solvents: Resorcinol, benzotrifluoride (anhydrous) and propylene glycol monomethyl ether acetate (PGMEA) were purchased from Sigma-Aldrich and used as received. Di-tert-butyl dicarbonate [(t-Boc)$_2$O] was purchased from Fluka (Sigma-Aldrich). 4-Hydroxybenzaldehyde was purchased from Alfa Aesar. Anhydrous Et$_2$O, THF, DMF and EtOH were purchased and used without further drying. 3M™ Novec™ Engineered Fluid HFE-7100, 7200, 7300 and 7500 were provided by 3M. 1,1,1,2,2,3,3,4,4,5,5,6,6,7,7,8,8-Heptadecafluoro-12-iodododecane 2, and N-nonafluorobutane-sulfonyloxy-1,8-naphthalimide 7 (FIG. 12(a)) were prepared according to the modified literature methods.

Characterization (FIGS. 1-16)

$^1$H NMR spectra were recorded on a Varian Inova-400 (400 MHz) or Inova-500 (500 MHz) spectrometer at ambient temperature, using the chemical shift of a residual protic solvent (CHCl$_3$ at δ 7.28 ppm, acetone at 2.05 ppm, or DMSO at δ 2.50 ppm) as an internal reference. All chemical shifts are quoted in parts per million (ppm) relative to the internal reference and coupling constants J are measured in Hz. The multiplicity of the signal is indicated as follows: s (singlet), d (doublet), t (triplet), q (quartet), m (multiplet), dd (doublet of doublets), dt (doublet of triplets), dm (doublet of multiplets) and br s (broad singlet). $^{13}$C NMR spectra were recorded on a Varian Inova-400 (100 MHz) or Inova-500 (125 MHz) spectrometer using the central resonance of the triplet of CDCl$_3$ at δ 77.0 ppm Infrared absorptions were measured for samples in a KBr pellet or on a NaCl window with a Mattson Instruments Galaxy 2020 spectrophotometer. Microanalyses were carried out by Quantitative Technologies, Inc. Mass spectrometry was performed by the Department of Molecular Biology and Genetics, Cornell University. Thermo gravimetric analysis (TGA) was performed on a TA instruments Q500 at a heating rate of 10° C. min$^{-1}$ under N$_2$. The glass transition temperature (T$_g$) of a resist material was measured on a TA Instruments Q1000 modulated differential scanning calorimeter (DSC) at a heat/cool rate of 10° C. min$^{-1}$ under N$_2$ for heat/cool/heat cycles. Powder X-ray diffraction (PXRD) patterns were obtained using a Scintag Theta-Theta XDS2000 diffractometer to examine the crystallinity of the bulk material. Size exclusion chromatography was performed on a Waters GPC system (Waters 486 UV detector) by eluting THF (1 cm$^3$ min$^{-1}$) at 40° C.

Synthesis of Resorcinarene Photoresist Materials (FIGS. 1-16)

4-(5,5,6,6,7,7,8,8,9,9,10,10,11,11,12,12,12-Heptadecafluorododecyloxy) benzaldehyde 3 (FIG. 1)

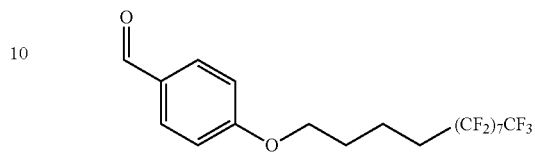

3

To a magnetically stirred solution of 2 (prepared by a modified literature procedure) (8.00 g, 13.3 mmol) and 4-hydroxybenzaldehyde (1.95 g, 15 9 mmol) in DMF (30 cm$^3$) was added K$_2$CO$_3$ (3.67 g, 26.6 mmol). The suspension was then heated to 70° C. After the solution was stirred for 2 h, the reaction was allowed to cool to ambient temperature and quenched by the addition of water (150 cm$^3$). The product was extracted with Et$_2$O (200 cm$^3$). The organic layer was washed with 1 M NaOH aqueous solution (100 cm$^3$), brine (100 cm$^3$), dried over anhydrous MgSO$_4$ and concentrated under reduced pressure. The crude product was purified by crystallization from MeOH (80 cm$^3$) to give the aldehyde 3 as colorless crystals (6.12 g, 80%); mp 50-51° C. (MeOH); (Found: C, 38.2; H, 2.1. C$_{19}$H$_{13}$F$_{17}$O$_2$ requires C, 38.3; H, 2.2%); IR (KBr) ν$_{max}$: 2955, 2887, 1687, 1601, 1515, 1311, 1257, 1217, 1153, 1042, 1013, 956, 841, 659 cm$^{-1}$; $^1$H NMR (500 MHz, CDCl$_3$): δ=1.82-1.88 (m, 2 H, CF$_2$CH$_2$CH$_2$), 1.91-1.97 (m, 2 H, CH$_2$CH$_2$O), 2.19 (ddd, J=8, 18, 27 Hz, 2 H, CF$_2$CH$_2$), 4.10 (t, J=6 Hz, 2 H, CH$_2$O), 7.00 (d, J=8.5 Hz, 2 H, Ar—H), 7.85 (d, J=8.5 Hz, 2 H, Ar—H), 9.90 ppm (s, 1 H, Ar—CHO); $^{13}$C NMR (125 MHz, CDCl$_3$): δ=17.5, 28.8, 30.9, 67.8, 114.9, 130.3, 132.3, 164.1, 191.0 ppm; m/z (MALDI) 597.11 [(M+H)$^+$. C$_{19}$H$_{14}$F$_{17}$O$_2$: requires M, 597.07].

Semi-perfluorododecylated resorcinarene 5 (FIG. 1)

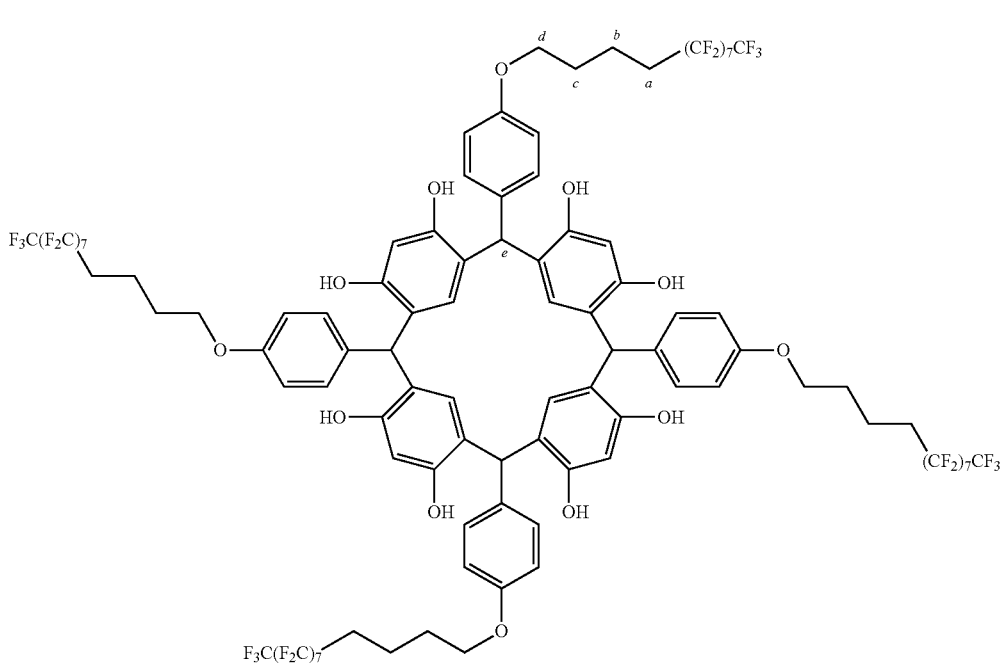

5

To a magnetically stirred solution of 3 (7.00 g, 11.7 mmol) and resorcinol (1.29 g, 11.7 mmol) in anhydrous EtOH (50 cm$^3$) was added concentrated HCl aqueous solution (2.3 cm$^3$) at 75° C. Just after the addition of HCl, the color of the reaction mixture changed to red with precipitation of solid particles. After the suspension was stirred for 2 h at 75° C., it was cooled to ambient temperature and filtered with washing with EtOH. The recovered solid was dispersed in EtOH (100 cm$^3$), stirred for 10 min and filtered again with washing with EtOH. The solid was then dried under reduced pressure at 50° C. to give the $R_F$-resorcinarene 5 as a pale-yellow powder (7.55 g); (Found: C, 42.7; H, 2.4. $C_{100}H_{68}F_{68}O_{12}$ requires C, 43.6; H, 2.5%); IR (KBr) $v_{max}$: 3400, 2953, 2927, 1617, 1512, 1246, 1206, 1153, 1079, 967, 829, 725, 708 cm$^{-1}$; $^1$H NMR (400 MHz, acetone-d$_6$): δ=1.77-2.00 (m, 16 H, 4×CH$_2$CH$_2$CH$_2$CF$_2$), 2.23-2.43 (m, 8 H, 4×CH$_2$CF$_2$), 3.88-4.16 (8 H, 4×OCH$_2$), 5.67-5.89 (4 H, 4×Ar$_3$CH), 6.18-6.80 (m, 24 H, Ar—H), 7.20-7.58 ppm (8 H, 8×Ar—OH); m/z (MALDI) 2775.4 [(M+Na)$^+$. $C_{100}H_{68}F_{68}NaO_{12}$ requires M, 2775.35].

Figure 2:
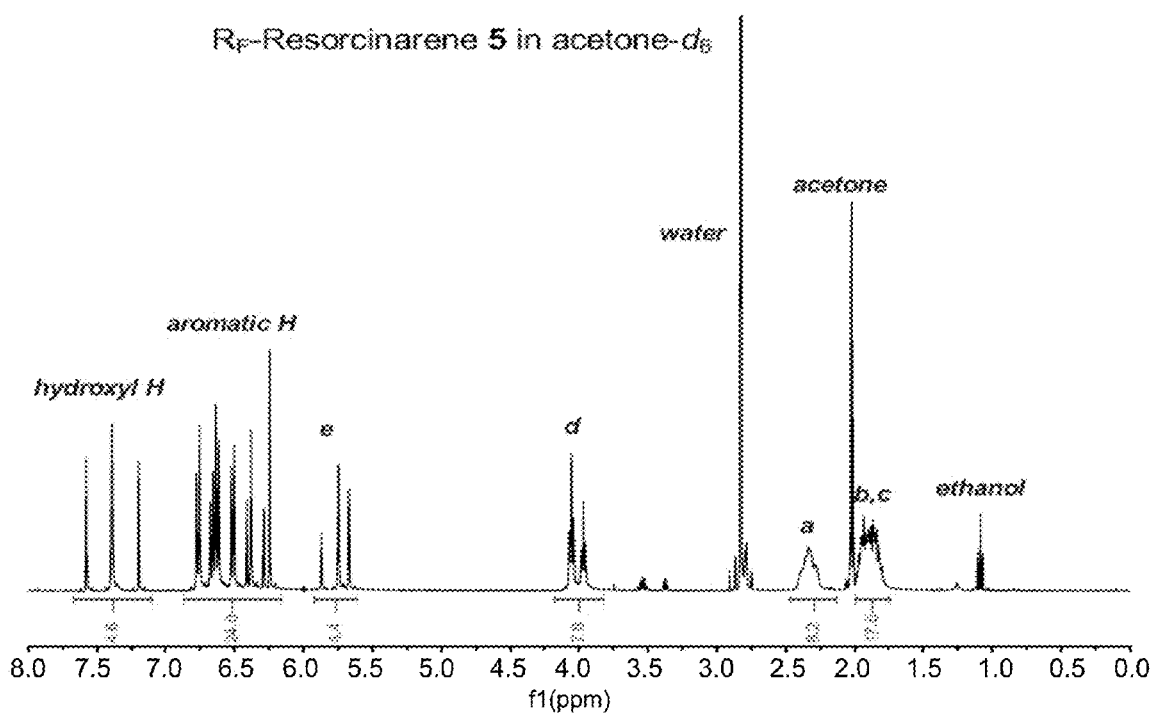
FIG. 2 is an $^1$H NMR spectrum the resorcinarene 5 shown in FIG. 1.
Figure 3:
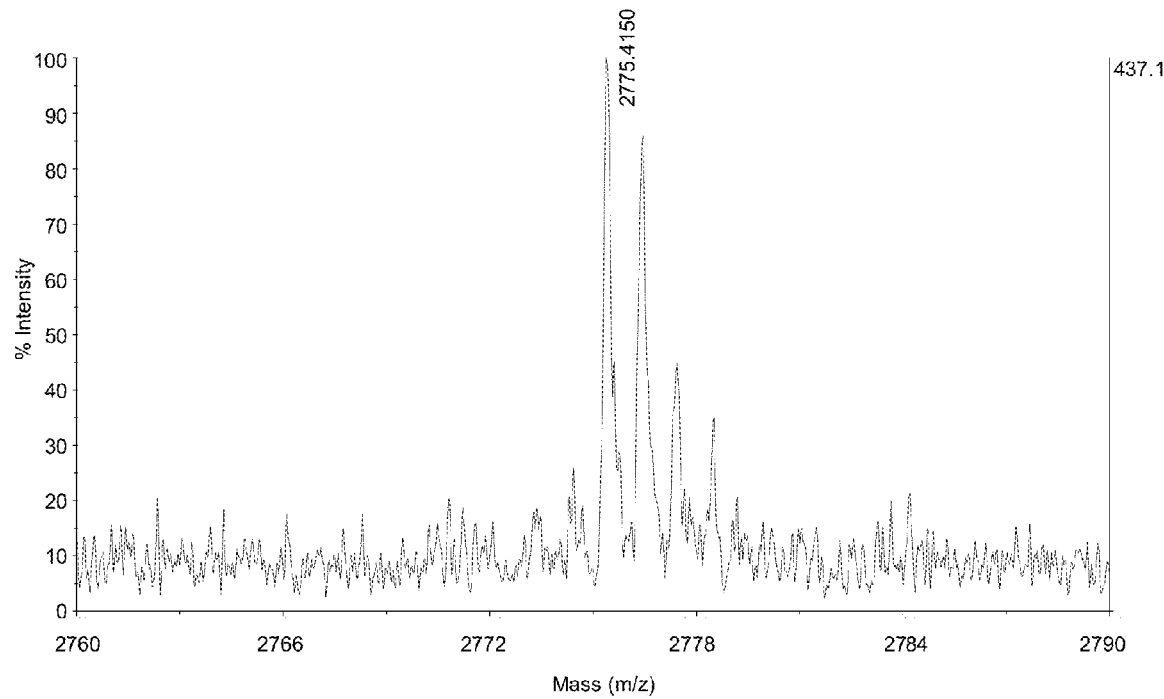
FIG. 3 is a mass spectrum of the resorcinarene 5 (m/z (MALDI-TOF) 2775.4 [$(M+Na)^+.C_{100}H_{68}F_{68}NaO_{12}$ requires M, 2775.35]) shown in FIG. 1.
Figure 4:
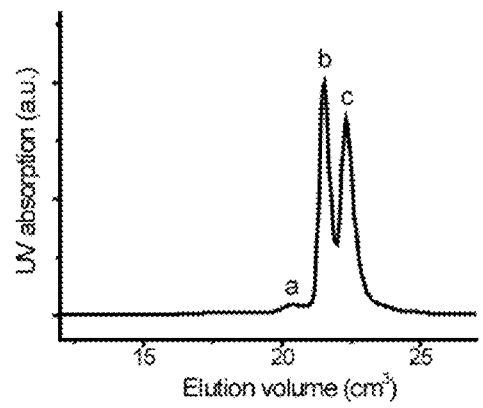
FIG. 4(a) is a size exclusion chromatogram of the resorcinarene 5 (peak a ($M_n$=5200, D=1.02), peak b ($M_n$=2500, D=1.01), peak c ($M_n$=1700, D=1.01)) shown in FIG. 1.
FIG. 4(b) is an XRD analysis of resorcinarene 5 and its t-Boc derivative 6 shown in FIG. 1.
Figure 4B:
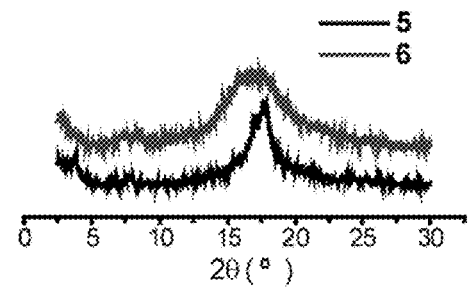

The $^1$H NMR spectrum and mass spectrum of $R_F$-resorcinarene 5 are illustrated in FIGS. 2 and 3, respectively; the size exclusion chromatogram of the resorcinarene 5 (peak a (Mn=5200, D=1.02), peak b (M$_n$=2500, D=1.01), peak c (M$_n$=1700, D=1.01)) is illustrated in FIG. 4(a); and the XRD analysis of resorcinarene 5 and its t-Boc derivative 6 is illustrated in FIG. 4(b).

t-Boc protection of the semi-perfluorododecylated resorcinarene 6

To a magnetically stirred solution of 5 (6.12 g, 2.22 mmol, partly soluble in THF) and 4-(dimethylamino)pyridine (0.271 g, 2.22 mmol) in THF (65 cm$^3$) was added a solution of (t-Boc)$_2$O (4.85 g, 22.2 mmol) in THF (15 cm$^3$) at ambient temperature. After the solution was stirred for 1 h, benzotrifluoride (120 cm$^3$) was added to it. The solution was stirred overnight and then washed with water (100 cm$^3$) three times. The organic layer was dried over anhydrous MgSO$_4$, passed through a short plug of silica gel with washing with benzotrifluoride and concentrated under reduced pressure. The concentrated solution was added to MeOH (500 cm$^3$) drop-wise. The precipitated powder was filtered and dried under reduced pressure to give t-Boc protected $R_F$-resorcinarene 6 as an off-white powder (6.64 g, 84%); (Found: C, 46.7; H, 3.7. $C_{140}H_{132}F_{68}O_{28}$ requires C, 47.3; H, 3.7%); Tg (DSC) 82° C.; dec. temp. (TGA) 156° C. (3% wt loss); IR (KBr) $v_{max}$: 2985, 2939, 2882, 1765, 1614, 1514, 1374, 1248, 1211, 1145, 1097, 1042, 854, 779, 723, 705, 654 cm$^{-1}$; $^1$H NMR (500 MHz, CDCl$_3$+CFCl$_3$): δ=1.25-1.47 [72 H, 8×(CH$_3$)$_3$C], 1.79-1.96 (m, 16 H, 4×CH$_2$CH$_2$CH$_2$CF$_2$), 2.08-2.25 (m, 8 H, 4×CH$_2$CF$_2$), 3.85-4.04 (8 H, 4×OCH$_2$), 5.63-5.75 (4 H, 4×Ar$_3$CH), 6.15-7.13 ppm (m, 24 H, Ar—H).

Figure 5:
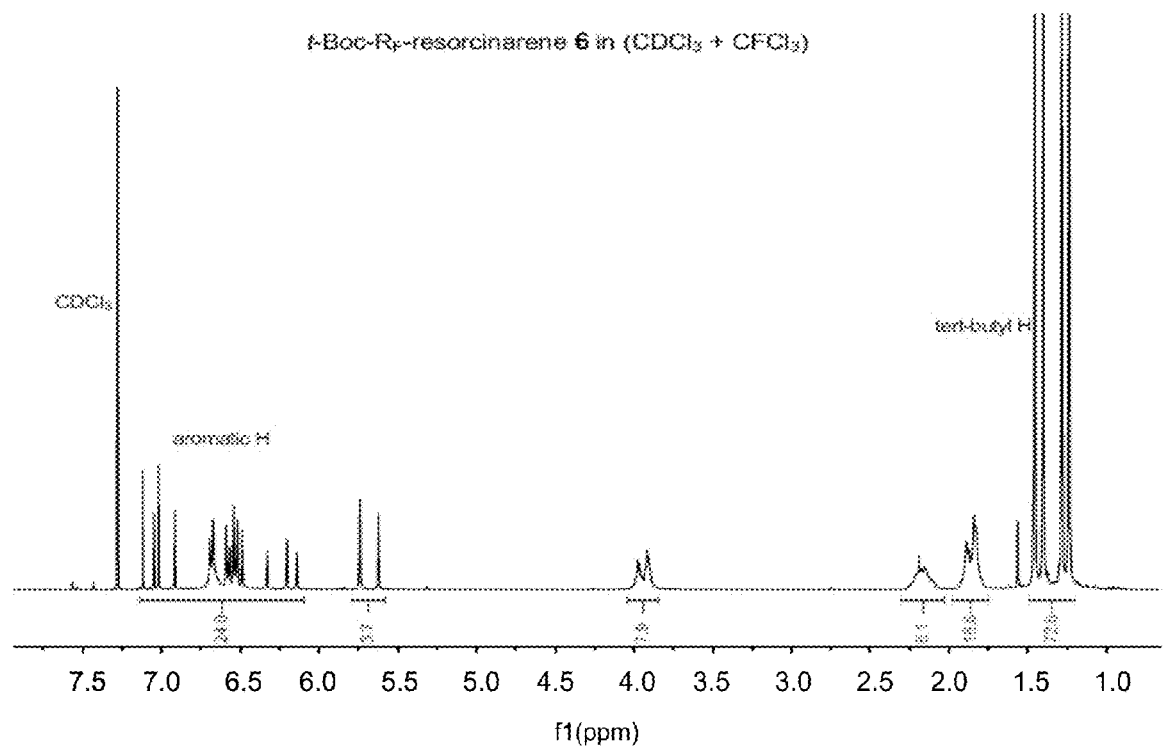
FIG. 5 is an $^1$H NMR spectrum of t-Boc protected $R_F$-resorcinarene 6 shown in FIG. 1.
Figure 6:
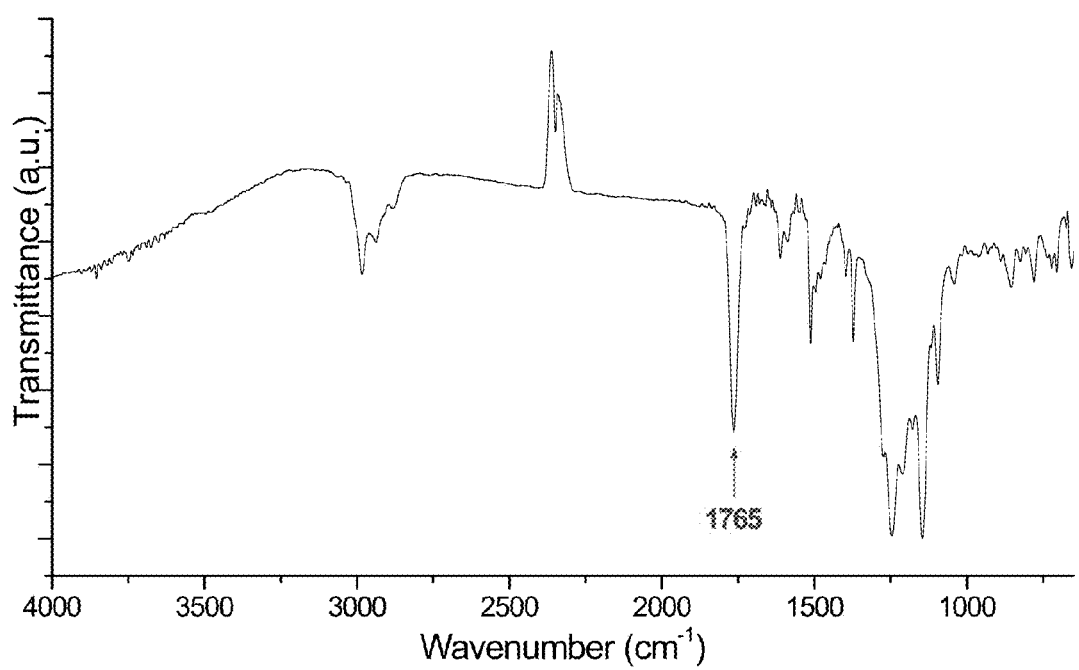
FIG. 6 is an IR spectrum of t-Boc protected $R_F$-resorcinarene 6 shown in FIG. 1.
Figure 7:
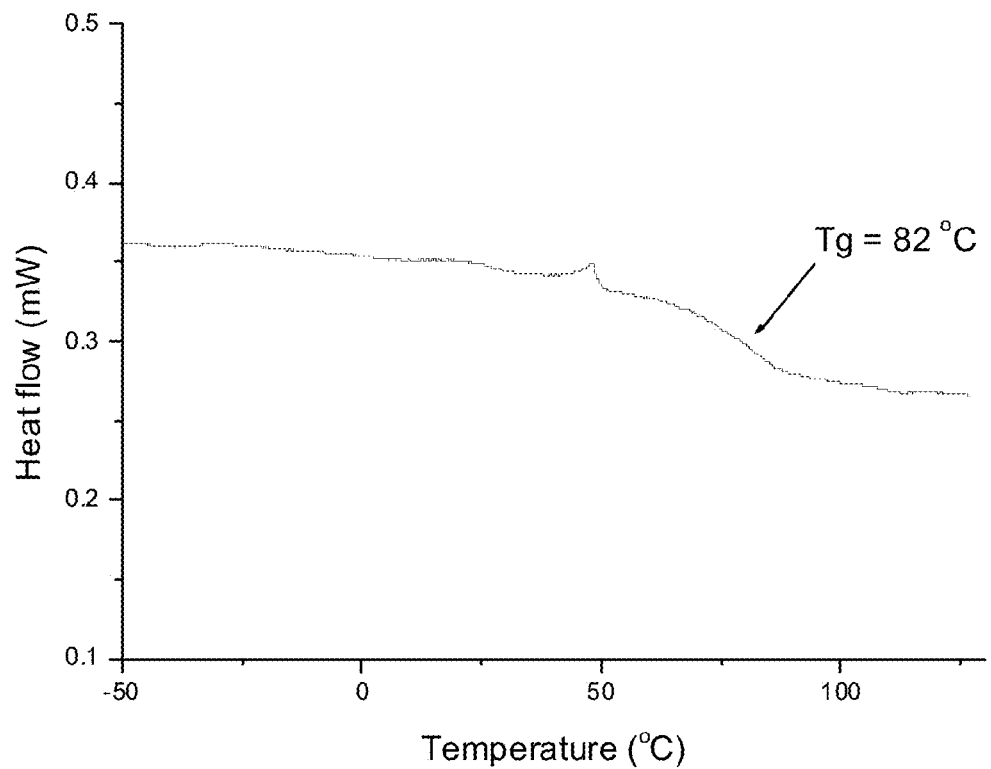
FIG. 7 is a DSC thermogram of t-Boc protected $R_F$-resorcinarene 6 shown in FIG. 1.
Figure 8:
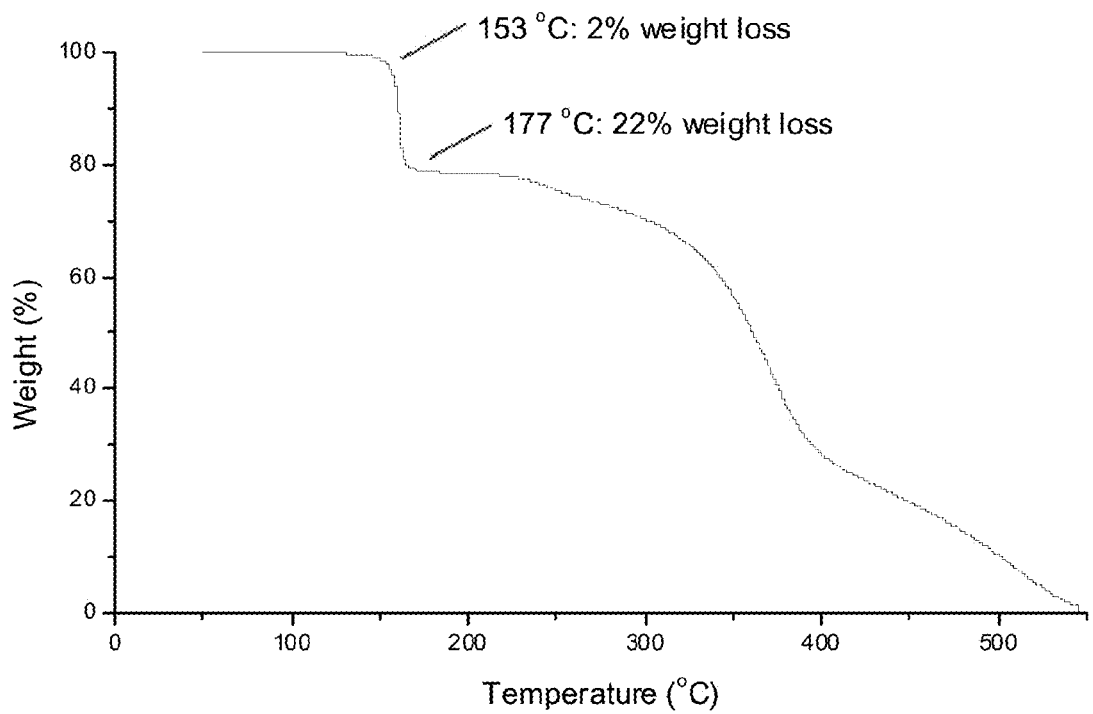
FIG. 8 is a TGA thermogram of t-Boc protected $R_F$-resorcinarene 6 shown in FIG. 1.
Figure 11:
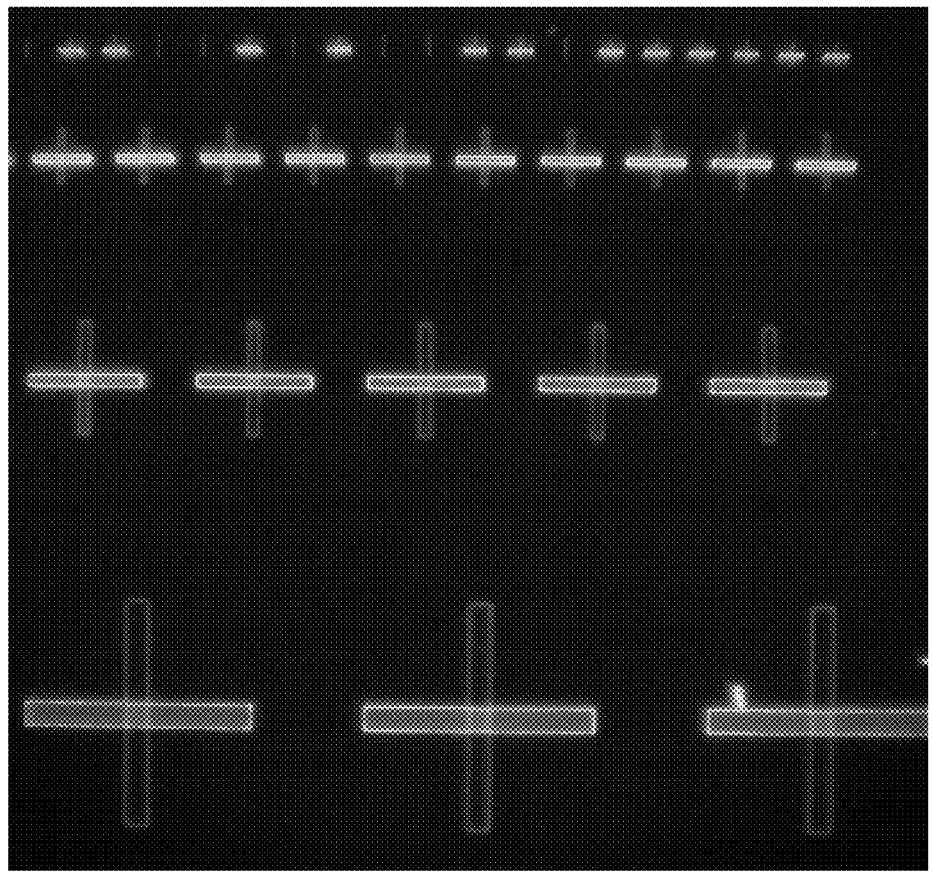
FIG. 11 illustrates a fluorescent microscope image of overlaid patterns (feature widths are 20, 10, 5 and 2 μm) of poly (9,9-dioctylfluorene) (top) and $[Ru(bpy)_3]^{2+}(PF_6^-)_2$ (bottom) in accordance with this disclosure.

The $^1$H NMR spectrum and IR spectrum of t-Boc protected $R_F$-resorcinarene 6 are illustrated in FIGS. 5 and 6, respectively; and the DSC and TGA thermograms of t-Boc protected $R_F$-resorcinarene 6 are illustrated in FIGS. 7 and 8, respectively.

Lithographic Evaluation (FIGS. 1-16)

The lithographic properties of t-Boc protected $R_F$-resorcinarene 6 using three different substrates (Si wafer, double polished glass wafer and polyimide-coated Si wafer) were investigated using a GCA Autostep 200 DSW i-line Wafer Stepper. In the case of polyimide coating, thick film of Photoneece® PWDC-1000 (Toray) was used on a 4" Si wafer. The resulting precursor film was then baked according to the heating/cooling program up to 350° C.

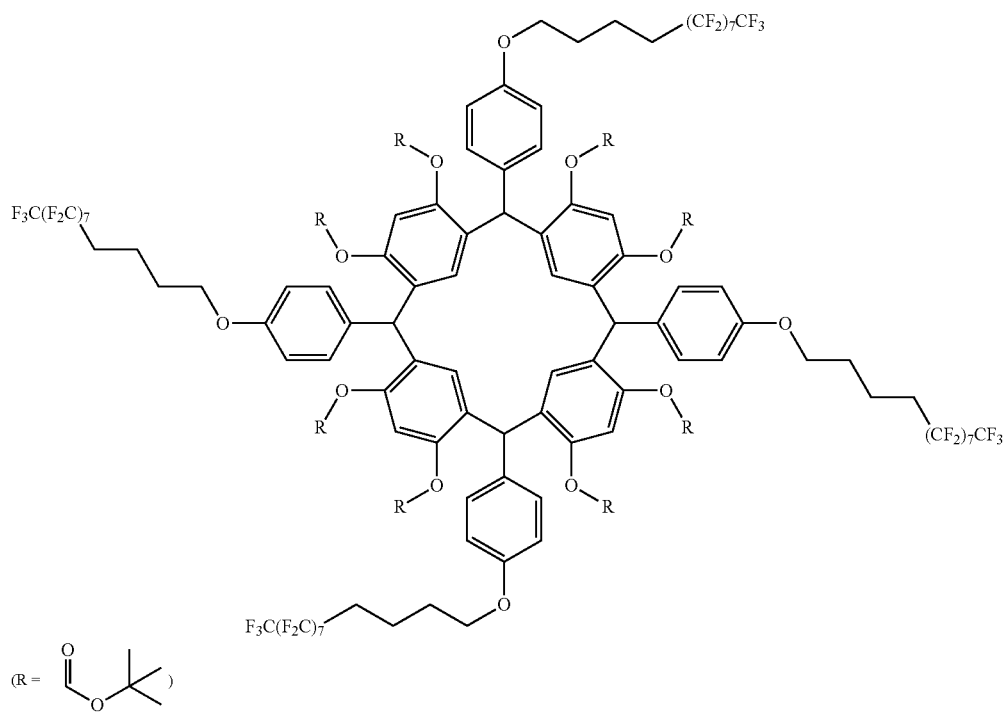

The resorcinarene films were spin-coated from a 10% (w/v) solution in a mixture of HFE-7500 (1.6 cm$^3$) and PGMEA (0.4 cm$^3$) containing 5% (w/w, with respect to the resist 6/PAG 7, prepared by a modified literature procedure). The spin-coating was performed at 2000 rpm (acceleration: 400 rpm s$^{-1}$) followed by post apply bake (PAB) at 70° C. for 60 seconds. The resulting film had a thickness of about 360 nm. The adequate exposure dose varied with the substrate. F the Si wafer, the dose was 84 mJ cm$^{-2}$; for the glass wafer, the dose was 120 mJ cm$^{-2}$; and, as illustrated in FIG. 10, the dose was 72 mJ cm$^{-2}$ for the polyimide-coated wafer.

After exposure the film was baked (post exposure bake, PEB) at 70° C. for 30 s, developed in HFE-7200 for 20 s and rinsed with HFE-7300. The thickness of the film after exposure was 265 nm due to the loss of t-Boc group upon deprotection reaction.

Additional Polymer Photoresists (P(FDMA-NBMA); FIGS. 17-28)

As indicated in FIGS. 17-18, other polymer photoresists and molecular glass photoresists which have an appropriate fluorine content are applicable to the techniques disclosed herein. For example, the photoresist material illustrated in FIGS. 17-18 works under identical conditions set forth above for the resorcinarene resist 5 of FIG. 1. The photoresist material is a copolymer of perfluorodecyl methacrylate and 2-nitrobenzyl methacrylate (P(FDMA-NBMA)) which has a light-sensitive component also showed a similar patterning capability to the resorcinarene resist 5. FIGS. 17-18 shows the structure of the copolymer P(FDMA-NBMA) and summarizes the general process scheme.

Referring to FIG. 18, the copolymer 10 is derived from the highly fluorinated perfluorodecyl methacrylate monomer 7 and the photo-labile 2-nitrobenzyl methacrylate monomer 8 was expected to yield a copolymer material which exhibits a solubility switch following UV irradiation. The photo-labile component, the ester of 2-nitrobenzyl alcohol and methacrylic acid, decomposes under UV exposure to yield a carboxylic acid and nitrosobenzaldehyde 11. The resulting polymer 12 is no longer soluble in a fluorinated solvent. Following development in a fluorinated solvent, the still-soluble unexposed regions are washed away to leave the insoluble exposed area as a negative-tone image.

The two monomers (7 and 8) were randomly copolymerized by radical initiation with 2,2'-azobis(2-methylpropionitrile) (AIBN). Multiple polymers were synthesized with varying compositions; polymers which lacked sufficient incorporation of the fluorinated monomer proved insoluble in a fluorinated solvent. Conversely, polymers without sufficient incorporation of the photosensitive monomer proved unpatternable. Percent compositions of the two monomers were varied to obtain optimum photosensitivity while still retaining enough fluorination to be processable in fluorinated solvents.

To demonstrate patterning properties, the polymer 10 was lithographically evaluated on both Si and glass substrates. Photoresist was spin-coated from HFE-7600 and then patterned under 248 and 365 nm exposure conditions. Pattern development was carried out in HFE-7200. FIG. 19 shows well-resolved sub-micron lines on Si and glass. It is notable that this photoresist is soluble in a fluorinated solvent, without a co-solvent, and that all processing steps are achieved through fluorinated solvents.

Sensitivity profiles were obtained for polymer 10 at both 248 and 365 nm. The polymer exhibits very different sensitivities at different wavelengths. At 248 nm, the dose is 84 mJ cm-2 whereas at 365 nm, the dose is 2700 mJ cm-2. However, this behavior is expected as the nitrobenzyl group is likely to undergo faster decomposition by the irradiation of high energy photons.

To further explore the patterning properties, the photoresist was also patterned under electron-beam (e-beam) exposure conditions. Well-resolved lines down to 100 nm were obtained, shown in FIG. 19(d).

It should be emphasized that the photosensitive monomer 9 was carefully selected to enable non-chemically amplified patterning; an imaging mechanism which does not rely on acid-catalyzed deprotection reactions. The advantages of this pathway are substantial, in particular, for the patterning of PEDOT:PSS films. PEDOT:PSS is a difficult material to pattern with acid-sensitive photoresists (i.e. photoresists requiring a photoacid generator) in that PEDOT:PSS itself, being highly acidic, can decompose the resist. Typically, following patterning with a chemically amplified resist, a thin layer (ca. 10-20 nm) of decomposed photoresist is left on the PEDOT:PSS interface.

Preliminary studies in PEDOT:PSS patterning were first carried out with our acid-stable photoresist. PEDOT:PSS was spin-coated onto an Si wafer in a thin film. The polymer 10 was then applied and subsequently removed. Before and after measurements showed the thickness of the PEDOT:PSS film to remain exactly the same, indicating no resist decomposition. Similarly, PEDOT:PSS was again spun-cast, followed by photoresist application. The photoresist was then flood-exposed with 248 nm UV light and subsequently removed. Before and after thickness measurements again show the PEDOT:PSS film unchanged. Therefore, no residual layers of decomposed resist were found, as with chemically-amplified resists. The PEDOT:PSS interface is left clean and unaffected following resist removal.

Two sets of ITO/PEDOT:PSS/Metal devices were fabricated and tested, one with PH 500 and one with AI4083 (PH500 and AI4083 commercially-available from H. C. Starck). A layer of photoresist was deposited onto the PEDOT:PSS films, flood-exposed with UV light and then removed. Reference devices were fabricated with pristine PEDOT:PSS films. Both sets of test devices showed essentially the same resistance and I-V curves as the reference devices, indicating that our photoresist has no detrimental effects on device performance These results collectively support our non-chemically amplified photoresist as an ideal material for PEDOT:PSS patterning.

The actual patterning of PEDOT:PSS film was then demonstrated. Photoresist films were spun-cast onto films of PEDOT:PSS and then patterned at 365 nm, shown in FIG. 19. Pattern resolution was consistent with that of the photoresist patterned on Si alone. Patterns were transferred to PEDOT:PSS via oxygen-plasma etching and the photoresist was subsequently removed. PEDOT:PSS patterns with sub-micron resolution were obtained.

To demonstrate the potential of this resist, we fabricated simple bottom-contact organic thin film transistors (OTFTs) with patterned pentacene film on top of patterned PEDOT:PSS source and drain electrodes. The optical image and atomic force microscopy (AFM) images of a typical 5 µm channel length OTFT device are shown in FIG. 20. FIG. 20(b) shows that the pentacene fully covers both the transistor channel and the PEDOT:PSS contacts, without any observable delamination occurring after lift-off in HFE. FIG. 20(c) shows that larger grains (~0.5 µm) are formed inside the channel, with a mean roughness of 40 nm. Pentacene attempts to grow into islands (~80 nm height) on the PEDOT:PSS contacts.

Transistor performance was evaluated in a high vacuum probe station. OTFTs with channel lengths of 5, 10, 20, and 50 microns were fabricated and tested. The typical electrical characteristics of a fabricated 5 µm channel length OTFT are shown in FIGS. 20(e)-20(f). The field effect mobility in the saturation regime was extracted from the transfer characteristics using the following equation:

$$I_{DS,saturation} = \frac{W}{2L} \cdot \mu_{sat} \cdot C_r \cdot (V_G - V_{TH})^2,$$

where IDS is the drain current, Cr is the capacitance per unit area of the gate dielectric layer, VG is the gate voltage, VTH is the threshold voltage. VTH was determined from the intercept in the plot of (IDS)1/2 vs. VG. For the presented device, the value of 0.029 cm2 V-1s-1 was obtained for the charge carrier mobility in the saturation regime. The on-off current ratio was found to be more than 104. For all fabricated devices, the channel length to channel width ratio was kept the same—therefore all other devices show similar performance. The obtained values for carrier mobility are higher or comparable to previously reported values for Pentacene channel, PEDOT:PSS electrodes OTFTs obtained by other patterning techniques.

Thus, non-chemically amplified resists for patterning organic electronic materials are disclosed that provide sub-micron patterning capabilities at 248 nm and 365 nm conditions and have shown 100 nm resolution under e-beam exposure. Sub-micron patterning of PEDOT:PSS is also disclosed, a material for which the disclosed photoresists are particularly suitable. A bottom-contact transistor patterned with the disclosed photoresists exhibits comparable or better performance than previously reported bottom-contact transistors of the same type obtained by other patterning techniques.

Experimental (FIGS. 17-28)

Materials: 3,3,4,4,5,5,6,6,7,7,8,8,9,9,10,10,10-Heptadecafluorodecyl methacrylate 1 and benzotrifluoride were purchased from Sigma-Aldrich and used as received. 2,2'-azobis(2-methylpropionitrile) was recrystallized from CHCl$_3$. 3M™ Novec™ Engineered Fluid HFE-7100, 7200, and 7600 were donated from 3M USA. PEDOT:PSS was purchased from H. C. Starck and used as received. Pentacene was purchased from Kintec and used as received.

Synthesis of the polymer photoresist 10: 2-Nitrobenzyl methacrylate 9 was prepared and purified by recrystallization from CH2Cl2-hexanes mixed solvent after column chromatography (1.05 g, 4.75 mmol) and 3,3,4,4,5,5,6,6,7,7,8,8,9,9,10,10,10-heptadecafluorodecyl methacrylate (5.95 g, 11.2 mmol) were added to a 25 cm3 schlenk tube. Benzotrifluoride (7 cm3) and 2,2'-azobis(2-methylpropionitrile) (AIBN, 0.07 g, 0.43 mmol) were then added to the mixture. The tube was sealed then degassed by three freeze-thaw cycles in liquid N$_2$ under reduced pressure. The solution was magnetically stirred at 72° C. for 12 hours under a N$_2$ atmosphere. The solution was precipitated in hexanes then dried under reduced pressure to give a colorless solid 3 (5.5 g); IR (KBr): ν=3002, 1737, 1537, 1480, 1348, 1211, 1151, 971, 788, 734, 705, 654 cm-1; 1H NMR [400 MHz, CDCl3 (1 part by vol.)+CFCl$_3$ (1 part by vol.), δ] 8.05 (br s, 1H, Ar—H), 7.67 (br s, 2H, Ar—H), 7.52 (br s, 1H, Ar—H), 5.39 (br s, 2H, ArCH2O), 4.26 (br s, 6H, CH2CF2), 2.50 (br s, 6H, CH2CH2CF2), 2.21-0.66 ppm (m, 20H); Mn=17,000, Mw/Mn=2.4.

The lithographic properties of the polymer 10 were investigated using two different substrates (Si and glass wafer) were investigated using a GCA Autostep 200 DSW i-line Wafer Stepper. The resist films were spin-coated from a resist (0.15 g) solution in HFE-7600 (1.5 g) at 2000 rpm followed by post-apply bake at 110° C. The resulting film had a thickness of ca. 460 nm After UV exposure, the film was baked at 110° C. for 60 seconds, developed in HFE-7200 for 40 seconds.

Bottom-contact transistors were fabricated as follows. A thin film of PEDOT:PSS (Clevios PH500, H.C. Stark) was spin-coated onto a Si wafer with 360 nm of thermally grown oxide and baked at 180° C. for 10 minutes. A layer of the polymer 10 was spin-coated onto the PEDOT:PSS film. The resist film was patterned in HFE-7200 and the remaining image was then transferred onto the PEDOT:PSS film via O$_2$-plasma etch. The resist film was then washed away in a 2-propanol (10% by vol.) HFE-7100 mixture. Onto this patterned PEDOT:PSS film was spin-coated another layer of the resist 10 which was also photo-patterned. A thin film (ca. 20 nm) of pentacene was thermally evaporated (substrate temperature −50° C., residue gas pressure <5×10-7 Torr, at a rate of 0.05 Å/s) onto the substrate. The resist film was lifted off in a 2-propanol (10% by vol.) HFE-7100 mixture to leave patterned pentacene on top of patterned PEDOT:PSS film.

The impact of fluorinated solvents on well-characterized and commercially available organic electronic materials was tested. One such organic electronic material is poly-3-hexylthiophene (P3HT), a prototypical conjugated polymer which is soluble in common non-polar organic solvents such as chlorobenzene and is extensively used in organic thin film transistors (OTFTs). A nominally identical batch of P3HT OTFTs was fabricated and tested them before and after a five minute immersion into a beaker filled with solvent and held at room temperature. In addition to the fluorinated solvents listed above, representative polar protic (isopropyl alcohol—IPA), polar aprotic (propylene glycol methyl ether acetate—PGMEA), and non-polar (p-xylene) solvents were also tested.

Another organic electronic material tested was ruthenium (II) tris(bipyridine) with hexafluorophosphate counter ions $\{[Ru(bpy)_3]^{2+}(PF_6^-)_2\}$. This material is an ionic metal complex which is soluble in polar solvents such as acetonitrile and is used in electroluminescent devices. A nominally identical batch of $[Ru(bpy)_3]^{2+}(PF_6^-)_2$ electroluminescent devices was fabricated, tested and exposed them to solvents according to the protocol discussed above. The details of device structure and fabrication are given below.

Figure 15A:
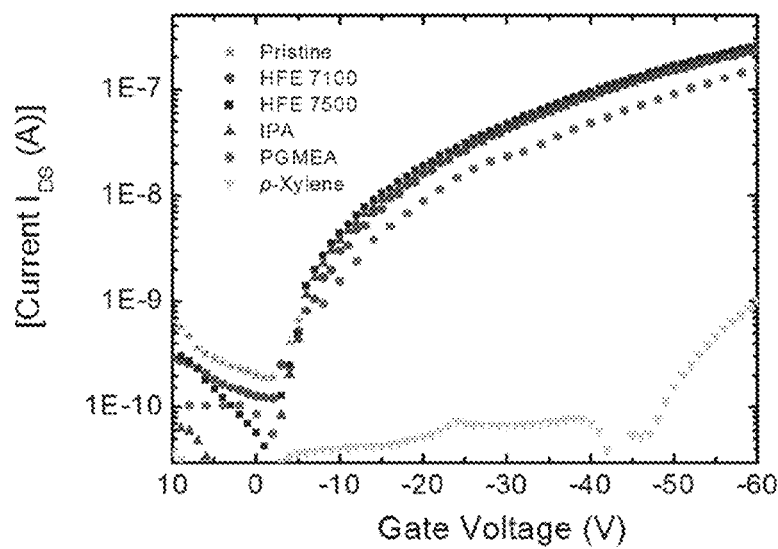
FIG. 15(a) graphically illustrates P3HT OTFT gate sweep curves taken at a source-drain voltage of −100V before and after solvent treatment.
Figure 15B:
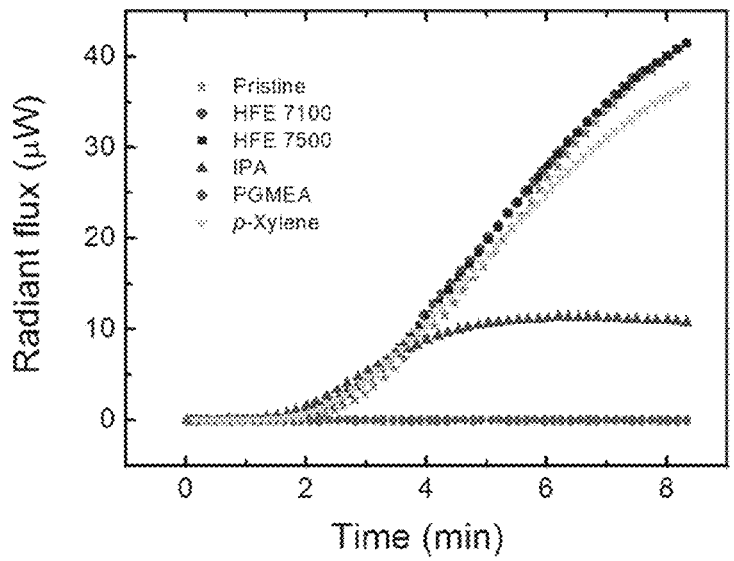
FIG. 15(b) graphically illustrates a temporal response of emission of $[Ru(bpy)_3]^{2+}(PF_6^-)_2$ electroluminescent devices at 3V applied bias before and after solvent treatment.
Figure 15C:
FIG. 15(c) is a photograph of a $[Ru(bpy)_3]^{2+}(PF_6^-)_2$ electroluminescent device operating in HFE illustrated in FIG. 14(a) under boiling conditions.

The results of solvent treatment on device performance are shown in FIG. 15 and are summarized Table 1 below:

TABLE 1

|  | Protic IPA | Aprotic PGMEA | Non-polar p-Xylene | Fluorous HFE 7100 | Fluorous HFE 7500 |
|---|---|---|---|---|---|
| P3HT | 95% | 90% | 0% | 100% | 100% |
| [Ru(bpy)$_3$]$^{2+}$(PF$_6^-$)$_2$ | 45% | 0% | 85% | 100% | 100% |

For the P3HT transistors, the transfer characteristics before and after solvent immersion are shown in FIG. 15. The initial field-effect hole mobility of the OTFTs was 1.0·10$^{-3}$ cm$^2$ V$^{-1}$s$^{-1}$ with a device-to-device variation of 10%. As expected, the transistors fared reasonably well in IPA and PGMEA, showing only a minor decrease in performance. It should be noted that PGMEA, which is extensively used in photolithography, has been utilized in the photolithographic patterning of P3HT and a few other organic materials. Immersion in the non-polar p-xylene, however, dissolved the P3HT film and resulted in severe device damage. On the other hand, immersion in the fluorinated solvents did not cause any device degradation, indicating that fluorinated solvents are excellent orthogonal solvents for P3HT.

Similar results were observed for the [Ru(bpy)$_3$]$^{2+}$(PF$_6^-$)$_2$ electroluminescent devices. FIG. 15 shows the results of solvent treatment in the emission characteristics of the devices.

The emission shows the characteristic delay associated with the redistribution of the $PF_6^-$ counter ions. Table 1 above shows the resulting loss in device external quantum efficiency upon solvent treatment. As expected, immersion in p-xylene resulted in a rather small loss of performance, while IPA caused a substantial decrease in device efficiency due to an increase in device current, and PGMEA lead to shorting of the devices and complete loss of electroluminescence. Once again, immersion in fluorinated solvents did not affect device performance. Therefore, fluorinated solvents are shown to be orthogonal solvents for at least two organic materials with very different polarities: P3HT and $[Ru(bpy)_3]^{2-}(PF_6)_2$.

To further demonstrate the orthogonality of fluorinated solvents, a $[Ru(bpy)_3]^{2+}(PF_6^-)_2$ electroluminescent device was operated in boiling HFE 7100 (61° C.) for one hour and no substantial change in its performance was observed. FIG. 15 shows the device operating in boiling HFE 7100. Similarly, immersion of a P3HT transistor in boiling HFE 7100 for one hour did not change the transistor characteristics. In addition to the above mentioned device results, we performed optical and atomic force microscopy on a variety of polymeric electronic materials including polyfluorene, poly(9,9-didecylfluorene-co-benzothiadiazole) (F8BT) and poly(3,4-ethylenedioxythiophene):poly(styrene sulfonate) (PEDOT: PSS), before and after immersion in boiling HFE 7100. No significant change of morphology and no pinhole formation, cracking, or delamination was observed, confirming the orthogonality of fluorinated solvents even under extreme conditions.

In another example, using HFE 7100 and HFE 7500, the semiconducting polymer poly(3-hexylthiophene) with head-to-tail regio-regularity >99% was obtained from Plextronics and used without further purification. $Ru(bpy)_3]^{2+}(PF_6^-)_2$ complex was synthesized according to known referenced procedures.

The electroluminescent devices were prepared as follows: 100 nm thick films were deposited on clean ITO/glass substrate by spin-coating filtered solutions of $[Ru(bpy)_3]^{2+}$ $(PF_6)_2$ (3 wt % in acetonitrle), followed by drying the films in nitrogen atmosphere at 60° C. for 12 h. After that 200 Å Au electrodes were directly deposited on the ruthenium complex film by thermal evaporation at a rate of 1 Å $s^{-1}$. The OTFTs were prepared as follows: A P3HT solution (1% weight in 1,2,4-trichlorobenzene) was spin coated at 3000 rpm on a highly-doped silicon wafer with a thermally-grown 200 nm $SiO_2$. The film was then annealed at 100° C. for 1 h in nitrogen atmosphere. Source and drain electrodes 300 Å Au electrodes were deposited onto the P3HT film via the shadow mask by thermal evaporation at a rate of 1 Å/s, defining channels of that were 100 μm long and 1.8 mm wide.

Figure 16A:
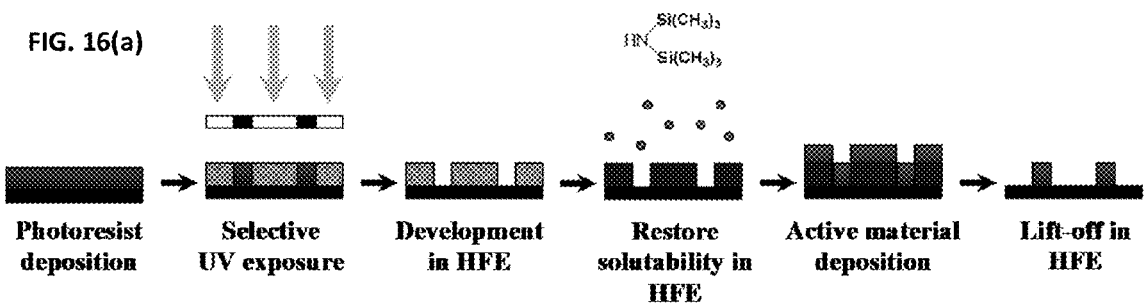
FIG. 16(a) schematically illustrates a disclosed HFE-based lift-off patterning technique for organic materials.
Figure 16B:
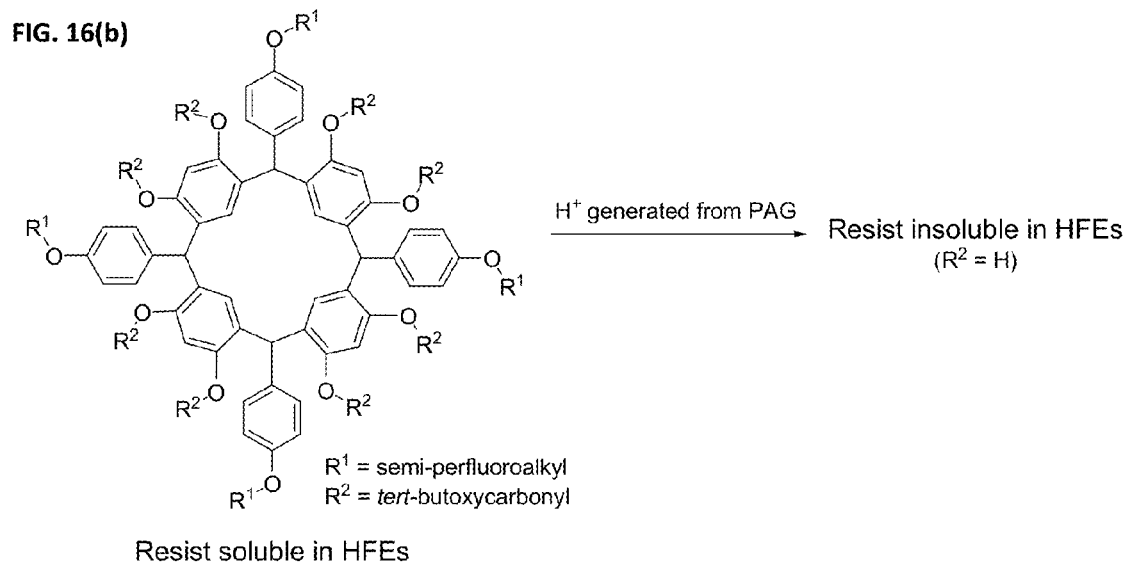
FIG. 16(b) schematically illustrates a disclosed imaging process of the photoresist employed in the HFE-based patterning illustrated in FIG. 16(a)
Figure 16C:
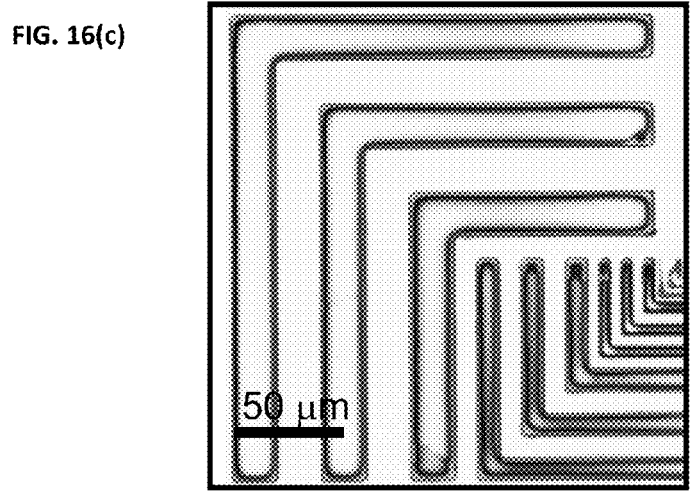
FIG. 16(c) is an optical micrograph of a patterned $[Ru(bpy)_3]^{2+}(PF_6^-)_2$ film.
Figure 19A:
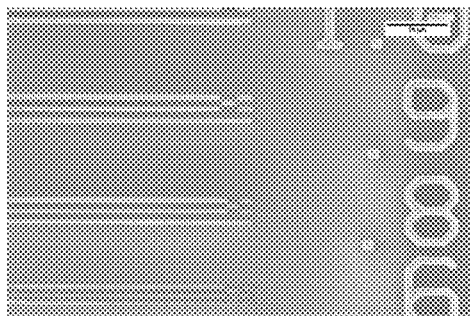
FIGS. 19(a)-19(d) are four patterned photoresist images of polymer 10 of FIG. 18 using HFE-7600 is a solvent and patterned under 248 and 365 nm exposure conditions including (a) at 365 nm on Si, (b) at 365 nm on glass, (c) at 365 nm on PEDOT:PSS film, and (d) e-beam exposure on Si.
Figure 19B:
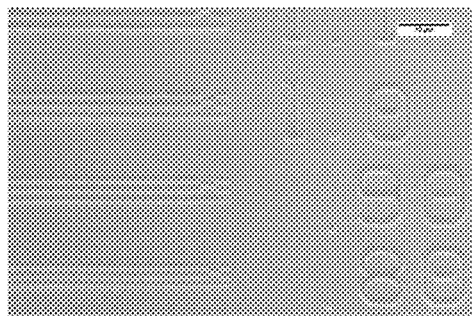
Figure 19C:
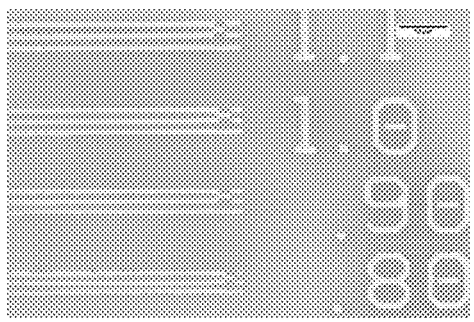
Figure 19D:
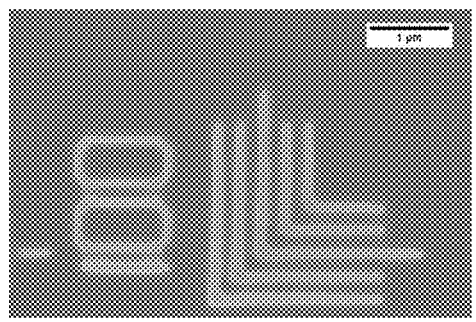
Figure 21:
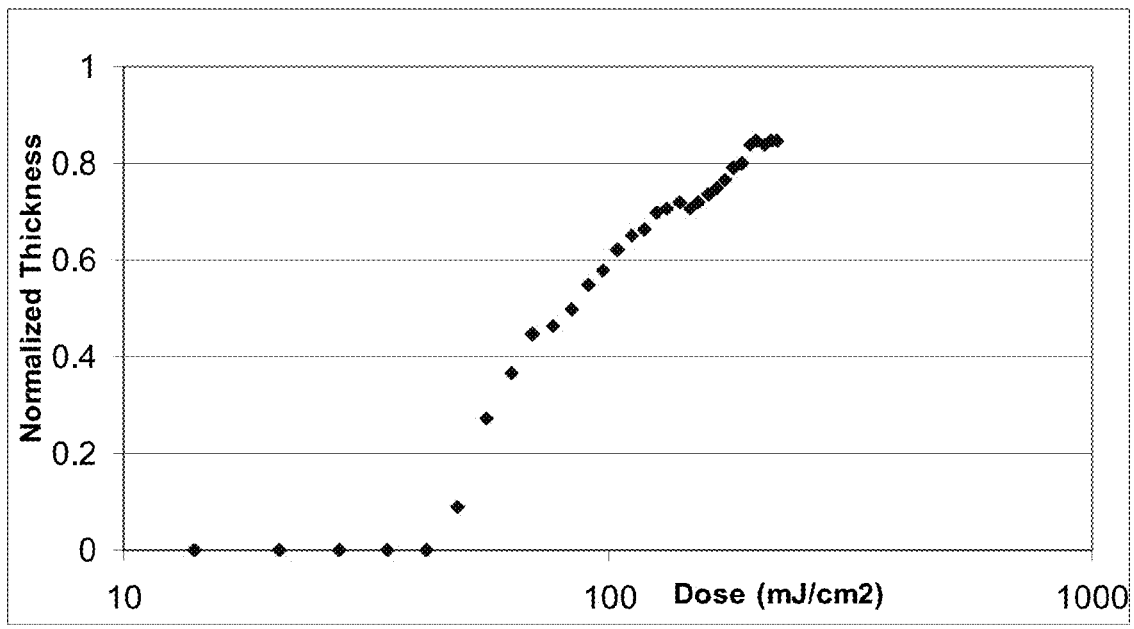
FIG. 21 is a contrast curve at 248 nm for polymer 10 of FIG. 18.
Figure 22:
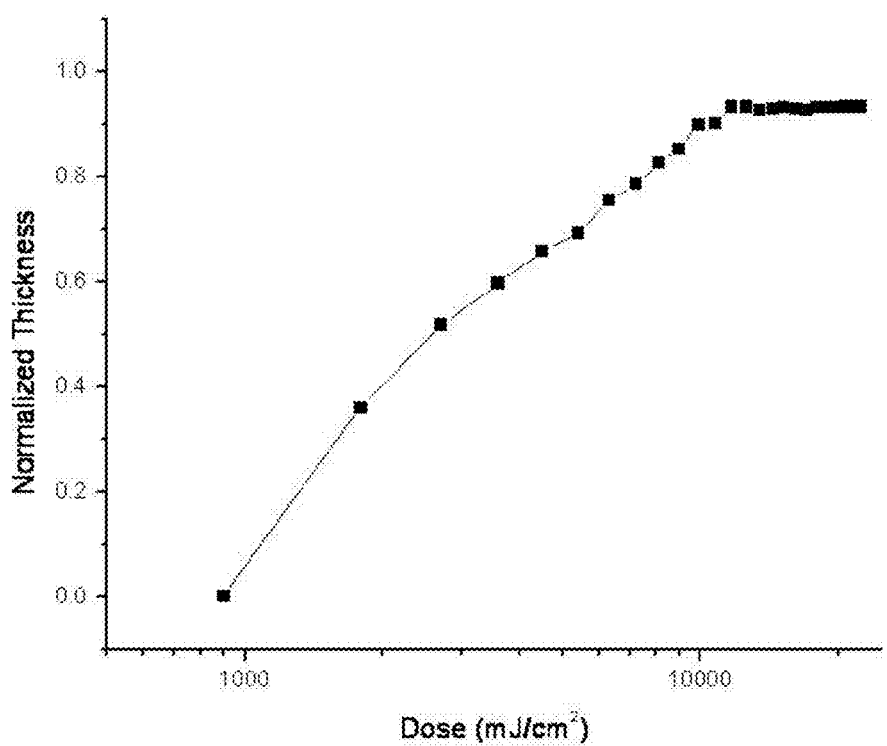
FIG. 22 is another contrast curve at 365 nm for polymer 10 of FIG. 18.
Figure 23:
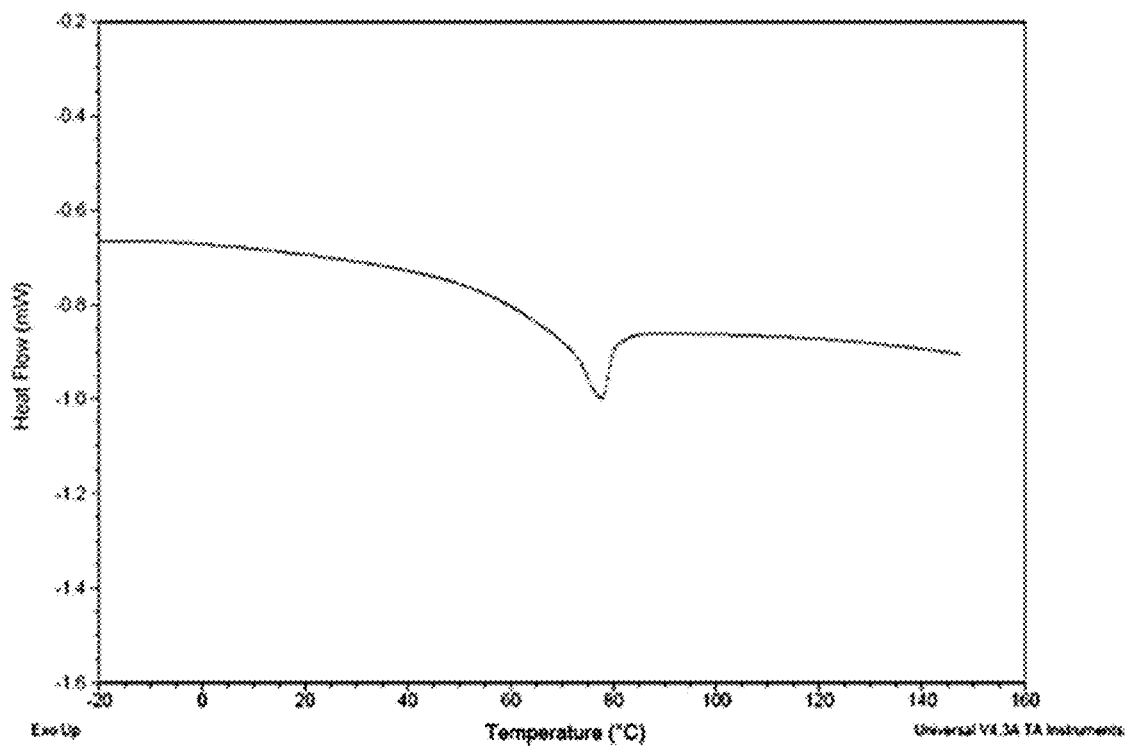
FIG. 23 is a differential scanning calorimetry (DSC) curve of polymer 10 of FIG. 18.
Figure 24:
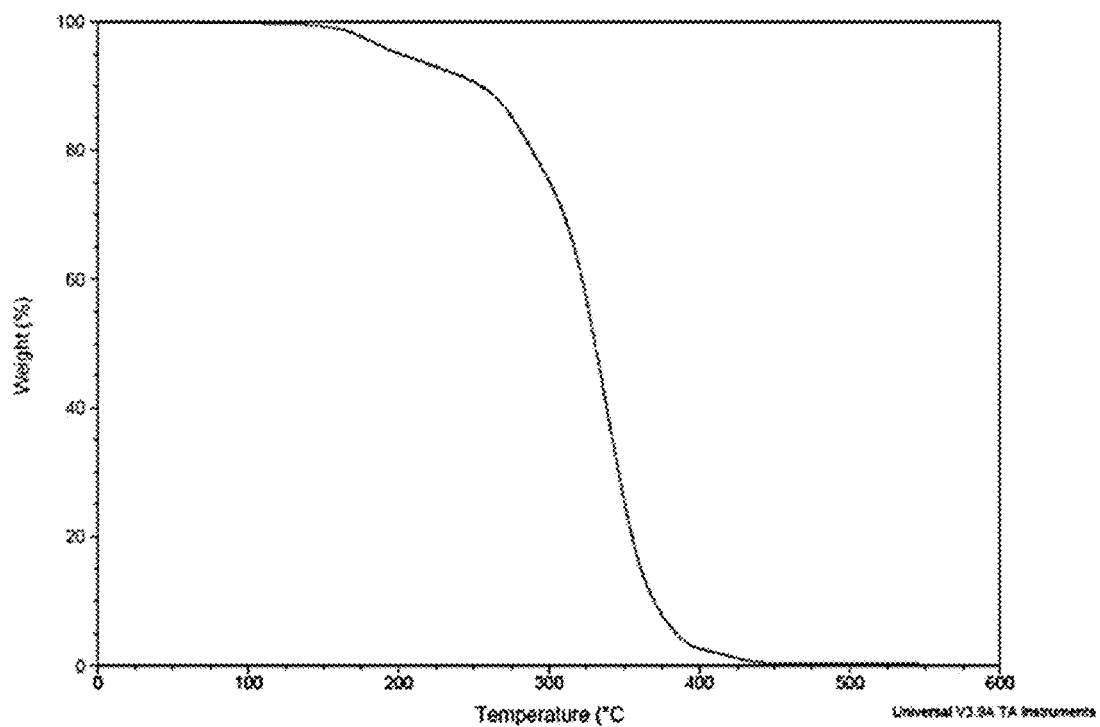
FIG. 24 is a thermogravimetric analysis (TGA) curve for polymer 10 of FIG. 18.
Figure 25:
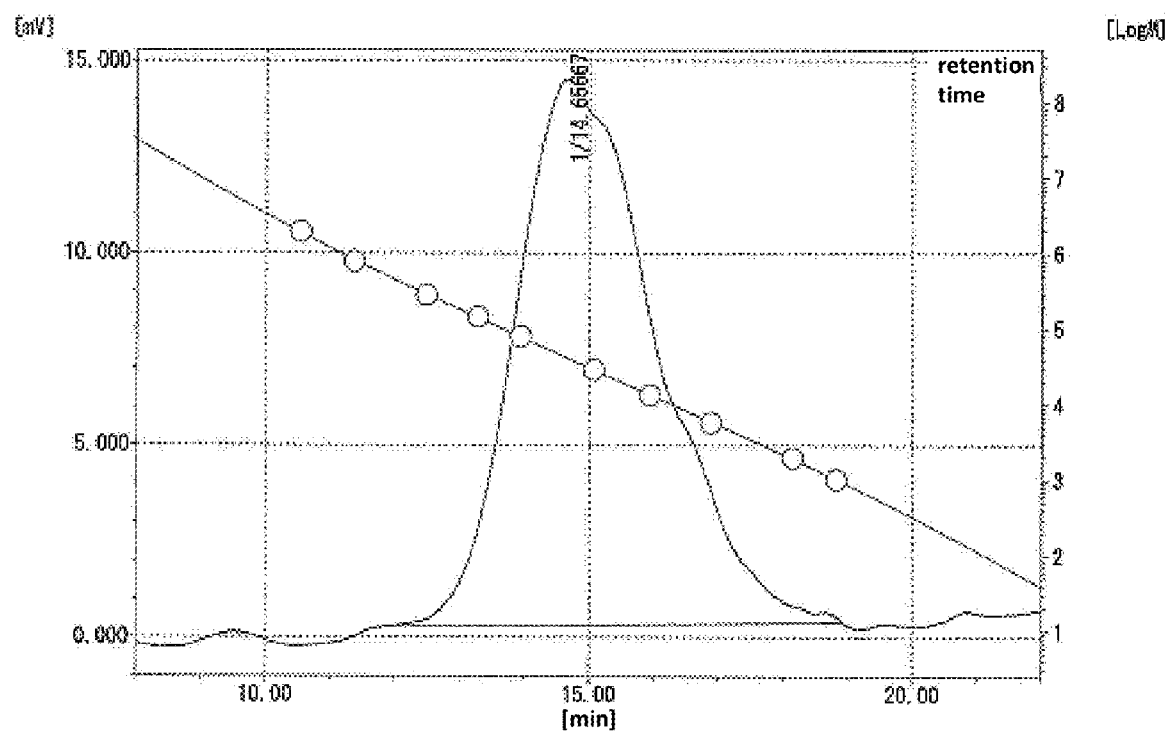
FIG. 25 is a gel permeation chromatography (GPC) curve for polymer 10 of FIG. 18.
Figure 26:
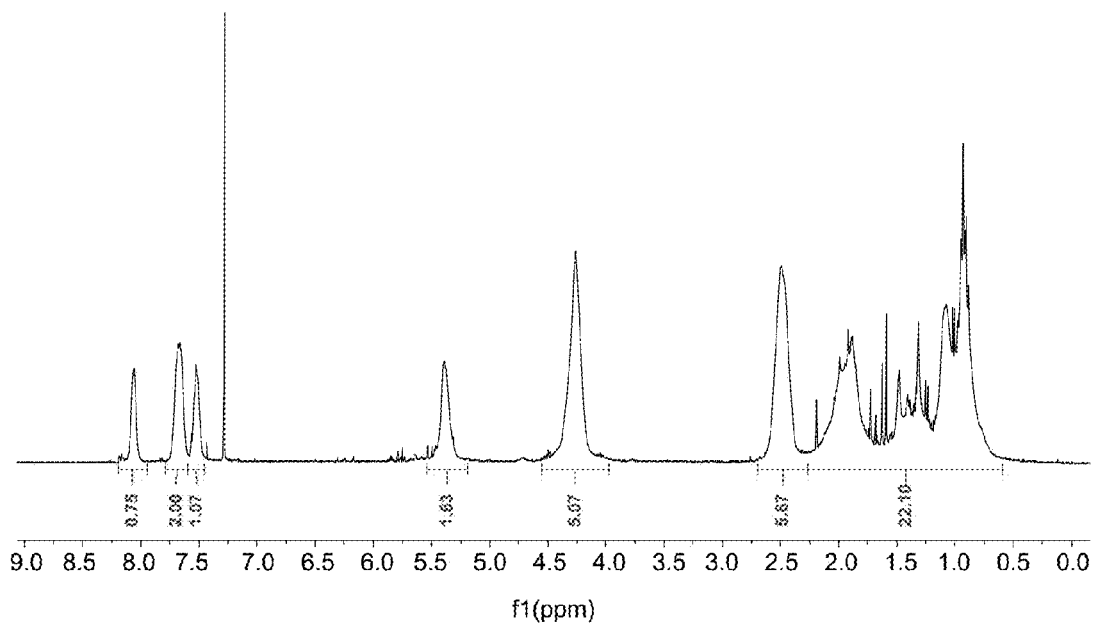
FIG. 26 is a nuclear magnetic resonance ($^1$H NMR) spectrum for polymer 10 of FIG. 18.
Figure 27:
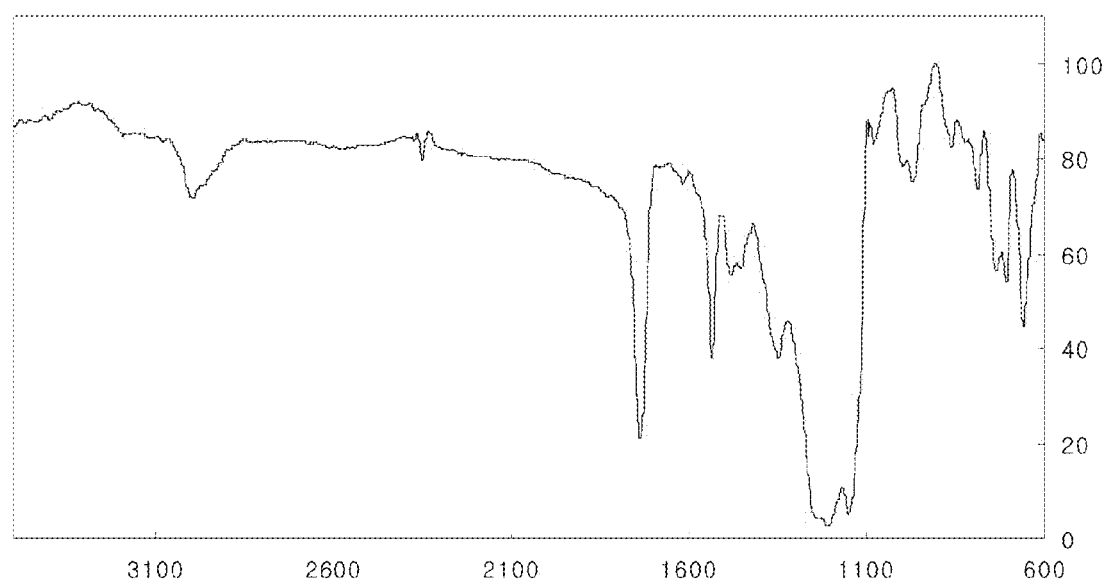
FIG. 27 is an infrared (IR) spectrum for polymer 10 of FIG. 18.

This new dimension in solvent orthogonality which is enabled by the use of fluorinated solvents and supercritical $CO_2$ offers unique opportunities for the chemical processing of organic electronic materials. One example is in the area of photolithographic processing. Specifically, one can use a photoresist that is properly fluorinated to be processable in fluorinated solvents Similar photoresists have been developed for processing using supercritical $CO_2$. This approach to the patterning of $[Ru(bpy)_3]^{2+}(PF_6^-)_2$ by employing a resist formulation composed of a resorcinarene photoresist and a photoacid generator (PAG) by a lift-off technique was successfully demonstrated as schematically illustrated in FIG. 16(a). The details of the photoresist synthesis and the photolithographic patterning process are given elsewhere. In brief, an HFE-processable negative-tone photoresist by appending four semi-perfluoroalkyl chains and eight acid-cleavable tert-butoxycarbonyl (t-Boc) groups to the resorcinarene molecule was synthesized. The lithographic pattern of the photoresist is formed by turning it into an insoluble form upon acid-catalyzed deprotection reaction, in which the acid is liberated from the photoacid generator (PAG) by UV exposure. The developed resist solubility in fluorinated solvents is restored via 1,1,1,3,3,3-hexamethyldisilazane (HMDS) treatment at an elevated temperature. A positive image of the active material is created by depositing an active material and subsequent resist lift off. The principal scheme of the technique is depicted in FIG. 16(b). A patterned $[Ru(bpy)_3]^{2+}(PF_6)_2$ film with featured down to the 2 rtm scale is shown in FIG. 16(c).

In conclusion, hydrofluoroethers (HFEs) represent a class of orthogonal solvents that are benign to a wide variety of organic electronic materials. HFEs offer a unique opportunity to move beyond the usual polar/non-polar axes in organic materials processing. Moreover, HFEs are environmentally friendly, "green" solvents, enabling chemical processing of organic electronic materials that can be readily adopted by industry. Coupled with fluorinated functional materials, they open new frontiers in materials processing, and have the potential to enable facile photolithographic patterning for organic electronics.

Figure 28:
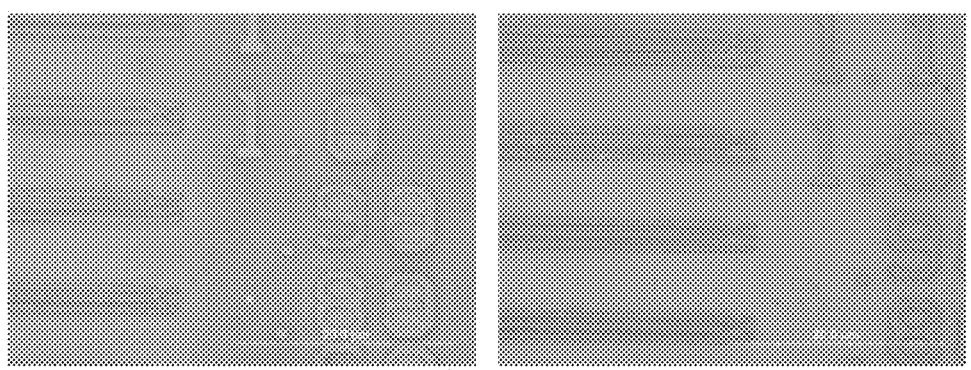
FIG. 28 presents two optical microscopic images of patterned PEDOT:PSS on a Si wafer.

Supercritical $CO_2$ as Solvent (FIG. 28)

According to another aspect of this disclosure, the supercritical $CO_2$ may be used to pattern organic structures as well. Supercritical carbon dioxide refers to carbon dioxide that is in a fluid state while also being at or above both its critical temperature and pressure, yielding specific properties. Supercritical carbon dioxide is becoming an important commercial and industrial solvent due to its role in chemical extraction in addition to its low toxicity and environmental impact. Although supercritical carbon dioxide is widely used as an extracting solvent in coffee decaffeinating, dry cleaning, fragrance extraction, etc., it is yet to be used as a solvent in the processing of organic electronic and electrical structures. The use of supercritical carbon dioxide is discussed below in connection with FIG. 29.

In one embodiment, supercritical $CO_2$ may be use with a fluorinated photoresist, such as the resorcinarene disclosed herein, to achieve a robust, high-resolution, high-throughput orthogonal process. Further, supercritical $CO_2$ may also be used with unfluorinated molecular glass photoresists to create organic electronic or electrical structures.

Figure 29:
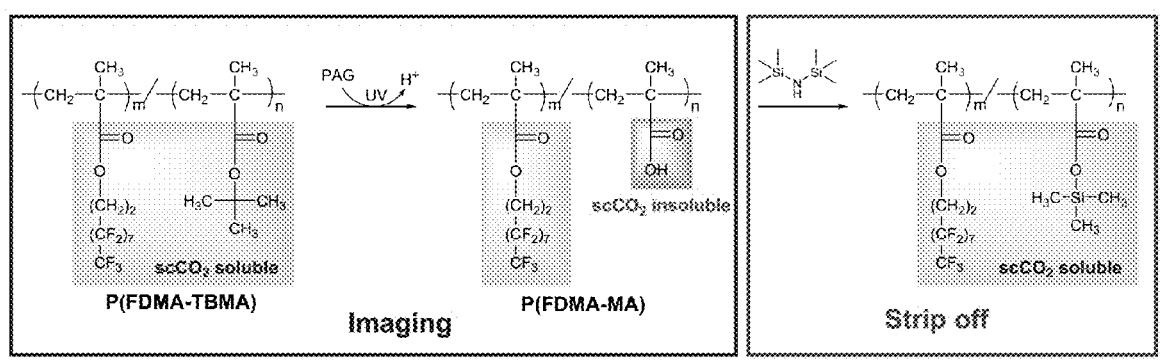
FIG. 29 illustrates a photolithography process utilizing supercritical carbon dioxide is a solvent as an alternative to the use of a fluorinated solvent.

In the case of a highly fluorinated photoresist material, for example, P(FDMA-TBMA), the photoresist material made patterns under UV exposure and development was carried out in supercritical carbon dioxide conditions. The developed photoresist image could be washed away in the mixture of supercritical carbon dioxide (>95 part by vol.) and hexamethyldisilazane (<5 part by vol.) at 40° C., 2000-5000 psi. FIG. 29 illustrates this concept.

While only certain embodiments have been set forth, alternatives and modifications will be apparent from the above description to those skilled in the art. These and other alternatives are considered equivalents and within the spirit and scope of this disclosure.

What is claimed is:

1. A method for patterning organic structures, the method comprising:
coating a substrate with a layer of fluorinated photoresist material, wherein the substrate comprises a first thin film of a first active organic electronic material;
selectively exposing portions of the layer of fluorinated photoresist material to radiation to form a first pattern of exposed fluorinated photoresist material and a second pattern of unexposed fluorinated photoresist material;

removing the second pattern of unexposed fluorinated photoresist material in a first fluorinated solvent thereby exposing portions of the substrate corresponding to the second pattern of unexposed fluorinated photoresist material;

depositing a second thin film of a second active organic electronic material over the first pattern of exposed fluorinated photoresist material and the substrate; and removing the first pattern of exposed fluorinated photoresist material with a second fluorinated solvent that is the same as or different from the first fluorinated solvent, thereby removing the second thin film on the first pattern of exposed fluorinated photoresist material and leaving a pattern of the second thin film on the portions of the substrate corresponding to the second pattern of unexposed fluorinated photoresist material.

2. The method of claim 1 wherein at least one of the first and second active organic electronic material comprises a semiconducting polymer or a small molecule.

3. The method of claim 1 wherein the first fluorinated solvent comprises a hydrofluoroether.

4. The method of claim 1 wherein the second fluorinated solvent comprises a hydrofluoroether.

5. The method of claim 1 wherein both the first and second fluorinated solvents comprise a hydrofluoroether.

6. The method of claim 1 wherein the organic structure forms at least part of an organic thin film transistor, an organic light-emitting diode, an organic photovoltaic, an organic sensor, or a combination thereof.

7. The method of claim 1 wherein the layer of fluorinated photoresist material is coated from a composition comprising a fluorinated coating solvent.

8. The method of claim 7 wherein the fluorinated coating solvent comprises at least one hydrofluoroether.

9. The method of claim 1 wherein the fluorinated photoresist material comprises a photo-acid generator.

10. The method of claim 9 wherein the photo-acid generator is non-ionic.

* * * * *